United States Patent
Yeo et al.

(10) Patent No.: US 10,141,454 B2
(45) Date of Patent: Nov. 27, 2018

(54) FIELD-EFFECT TRANSISTORS HAVING BLACK PHOSPHORUS CHANNEL AND METHODS OF MAKING THE SAME

(71) Applicant: Taiwan Semiconductor Manufacturing Company, Ltd., Hsin-Chu (TW)

(72) Inventors: Yee-Chia Yeo, Hsinchu (TW); Ling-Yen Yeh, Hsinchu (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 0 days.

(21) Appl. No.: 15/918,846

(22) Filed: Mar. 12, 2018

(65) Prior Publication Data

US 2018/0204956 A1    Jul. 19, 2018

Related U.S. Application Data

(60) Continuation of application No. 15/477,279, filed on Apr. 3, 2017, now Pat. No. 9,929,282, which is a
(Continued)

(51) Int. Cl.
*H01L 21/338* (2006.01)
*H01L 21/8238* (2006.01)
(Continued)

(52) U.S. Cl.
CPC .... *H01L 29/78696* (2013.01); *H01L 23/3171* (2013.01); *H01L 27/1203* (2013.01);
(Continued)

(58) Field of Classification Search
CPC .......... H01L 21/47573; H01L 23/3171; H01L 29/66795; H01L 29/78696
(Continued)

(56) References Cited

U.S. PATENT DOCUMENTS

2016/0155839 A1    6/2016  Strachan et al.
2016/0178569 A1    6/2016  Hoffman et al.
(Continued)

OTHER PUBLICATIONS

P. W. Bridgman, "Two New Modifications of Phosphorus", 1914, pp. 1344, vol. 36, No. 7, Journal of the American Chemical Society.
(Continued)

*Primary Examiner* — David S Blum
(74) *Attorney, Agent, or Firm* — Haynes and Boone, LLP

(57) ABSTRACT

Various transistors, such as field-effect transistors, and methods of fabricating the transistors are disclosed herein. An exemplary transistor includes a phosphorene-containing layer having a channel region, a source region, and a drain region defined therein. A passivation layer is disposed over the phosphorene-containing layer. A source contact and a drain contact extend through the passivation layer, such that the source contact and the drain contact are respectively coupled with the source region and the drain region. A gate stack is disposed over the channel region. In some embodiments, the gate stack includes a gate dielectric layer and a gate electrode layer, where the gate dielectric layer extends through the passivation layer and contacts the channel region. In some embodiments, the gate stack includes a gate electrode layer disposed over the passivation layer, and a portion of the passivation layer serves as a gate dielectric layer of the gate stack.

20 Claims, 21 Drawing Sheets

Related U.S. Application Data division of application No. 14/969,813, filed on Dec. 15, 2015, now Pat. No. 9,620,627.

(51) Int. Cl.

| | |
|---|---|
| *H01L 29/786* | (2006.01) |
| *H01L 29/24* | (2006.01) |
| *H01L 27/12* | (2006.01) |
| *H01L 29/10* | (2006.01) |
| *H01L 23/31* | (2006.01) |
| *H01L 29/08* | (2006.01) |

(52) U.S. Cl.
CPC ...... *H01L 29/0847* (2013.01); *H01L 29/1033* (2013.01); *H01L 29/24* (2013.01)

(58) Field of Classification Search
USPC .................................................. 438/168, 216
See application file for complete search history.

(56) References Cited

U.S. PATENT DOCUMENTS

| | | |
|---|---|---|
| 2016/0180019 A1 | 6/2016 | Van Rooyen et al. |
| 2016/0265047 A1 | 9/2016 | Van Rooyen et al. |

OTHER PUBLICATIONS

R. W. Keyes, "The Electrical Properties of Black Phosphorus", 1953, pp. 580, vol. 92, No. 3, Physical Review.

L. Cartz, S. R. Srinivasa, R. J. Riedner, J.D. Jorgensen, and T. G. Worlton, "Effect of pressure on bonding in black phosphorus", 1979, pp. 1718, vol. 71, The Journal of Chemical Physics.

A. Morita, "Semiconducting Black Phosphorus", 1986, pp. 227-242, vol. 39, Applied Physics A.

S.-L. Yau, T.P. Moffat, A. J. Bard, Z. Zhang, and M. M. Lerner, "STM of the (010) surface of orthorhombic phosphorus", Apr. 1992, pp. 383, vol. 198, No. 3,4, Chemical Physics Letters.

J. Kedzierski, P. Xuan, V. Subramanian, J. Bokor, T.-J. King, and C. Hu, "A 20 nm gate length ultra-thin body p-MOSFET with silicide source drain",2000, pp. 445, vol. 28, No. 5/6, Superlattices and Microstructures.

T. Low, M. F. Li, W.J. Fan, S. T. Ng, Y.-C. Yeo, C. Zhu, A. Chin, L. Chan and D.-L. Kwong, "Impact of Surface Roughness on Silicon and Germanium Ultra-Thin-Body MOSFETs", 2004, pp. 151, IEEE International Electron Device Meeting.

T.-Y. Liow, K.-M. Tan, R. T. P. Lee, M. Zhu, B. L.-H. Tan, N. Balasubramanian, and Y.-C. Yeo, "Germanium Source and Drain Stressors for Ultrathin-Body and Nanowire Field-Effect Transistors", Jul. 2008, pp. 808, vol. 29, No. 7, IEEE Electron Device Letters.

M. Poljak, V. Jovanovic, D. Grgec, and T. Suligoj, "Assessment of Electron Mobility in Ultrathin-Body InGaAs-on-Insulator MOSFETs Using Physics-Based Modeling", Jun. 2012, pp. 1636, vol. 59, No. 6, IEEE Transactions on Electron Devices.

L. Li, Y. Yu, G. J. Ye, Q. Ge, X. Ou, H. Wu, D. Feng, X. H. Chen, and Y. Zhang, "Black phosphorus field-effect transistors", May 2014, pp. 372, vol. 9, Nature Nanotechnology.

M. Kopf, N. Eckstein, D. Pfister, C. Grotz, I. Kruger, M. Greiwe, T. Hansen, H. Kohlmann, and T. Nilges, "Access and in situ growth of phosphorene-precursor black phosphorus", Jun. 2014, pp. 6-10, vol. 405, Journal of Crystal Growth.

J. Qiao, X. Kong, Z.-X. Hu, F. Yang, and W. Ji, "High-mobility transport anisotropy and linear dichroism in few-layer black phosphorus", Jul. 2014, pp. 4475, vol. 5, Nature Communications.

H. Wang, X. Wang, F. Xia, L. Wang, H. Jiang, Q. Xia, M. L. Chin, M. Dubey, and S.-J. Han, "Black Phosphorus Radio-Frequency Transistors", Oct. 2014, pp. 6424, vol. 14, Nano Letters.

J. O. Island, G. A. Steele, H. S. J. Van Der Zant, and A. Castellanos-Gomez, "Environmental instability of few-layer black phosphorus", Jan. 2015, vol. 2, No. 1, 2D Materials.

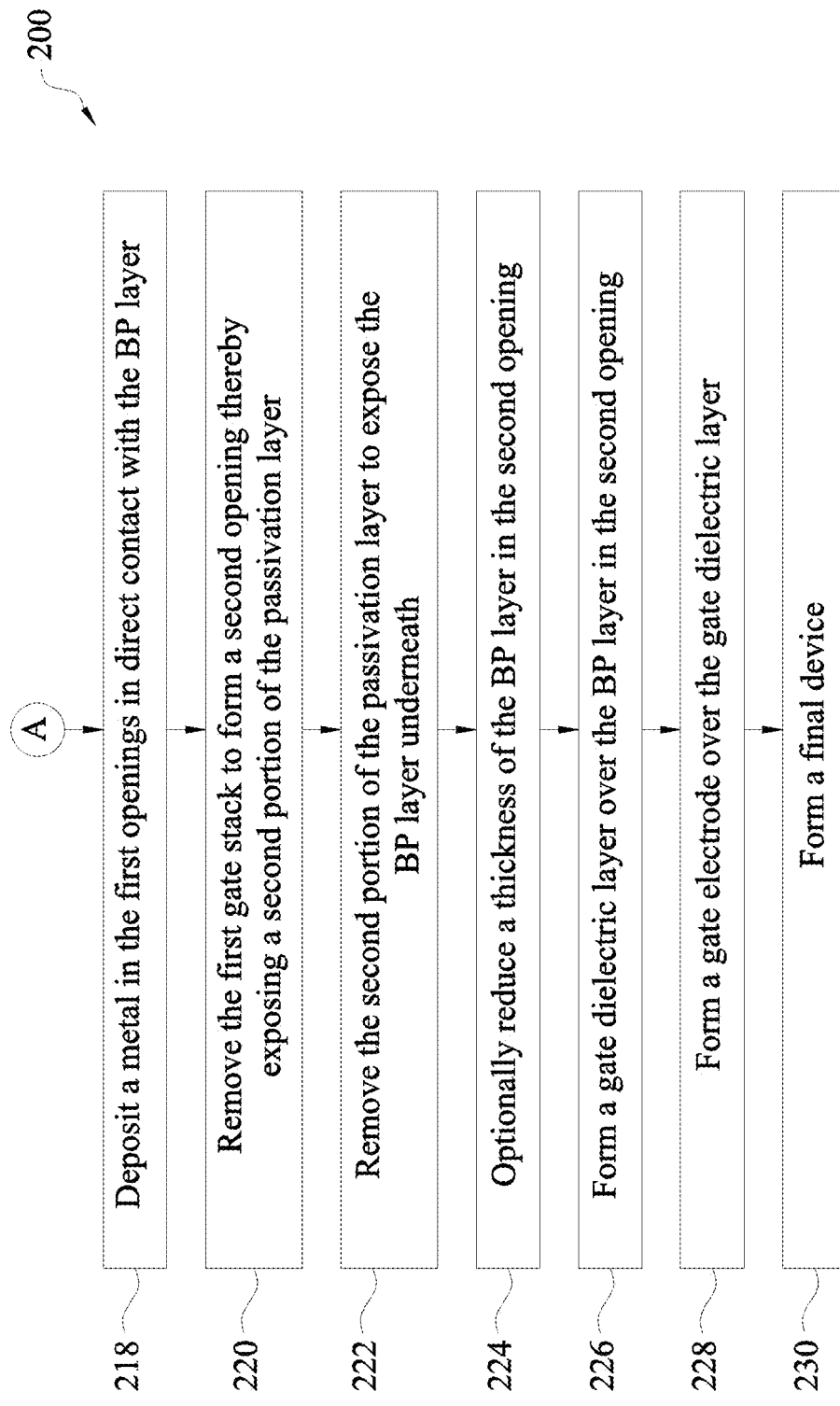

FIELD-EFFECT TRANSISTORS HAVING BLACK PHOSPHORUS CHANNEL AND METHODS OF MAKING THE SAME

This application is a continuation application of U. S. patent application Ser. No. 15/477,279, filed Apr. 3, 2017, now U.S. Pat. No. 9,929,282, which is a divisional application of U.S. patent application Ser. No. 14/969,813, filed Dec. 15, 2015, now U.S. Pat. No. 9,620,627, the entire disclosures of which are incorporated herein by reference.

BACKGROUND

A metal-oxide-semiconductor field-effect transistor (MOSFET), or simply a field-effect transistor (FET) or a transistor, is widely used in integrated circuits (ICs), including digital integrated circuits, radio frequency (RF) analog circuits, etc. The gate length of a transistor is reduced or scaled down to increase the packing density of transistors in an IC and to increase the speed performance thereof. However, transistors with aggressively miniaturized gate lengths suffer from undesirable short-channel effects, such as increased off-state leakage current.

To effectively suppress short-channel effects in transistors having gate lengths smaller than about 20 nanometers (nm), one way is to employ a semiconducting channel with reduced thickness, e.g. less than 5 nm. A transistor having a semiconductor channel with a thickness less than one-third or even one-quarter of its gate length is commonly known as an ultra-thin body transistor. Ultra-thin body transistors may employ ultra-thin semiconductor channel materials. One type of ultra-thin semiconductor materials with high mobility is black phosphorus (BP). BP is a layered material. A monolayer of BP, termed "phosphorene," is a semiconductor with a direct band gap of about 2 eV at the Γ point of the first Brillouin zone. When a number of layers of phosphorene are stacked, the multi-layer BP has a reduced band gap, with the band gap reduced to about 0.3 eV for bulk BP.

However, existing methods of fabricating transistors with BP channel suffer from various problems. One problem is that many of these transistors were realized using mechanically exfoliated BP layers. It is difficult to employ the mechanical exfoliation technique to mass produce transistors with BP channels for large-scale ICs.

Another problem is the exposure of the BP layers to air or moisture in the ambient prior to gate dielectric formation. Upon exposure to air, the surface of a BP layer becomes oxidized, and adsorbs moisture from the air. This irreversibly converts the BP surface to phosphorus oxide ($PO_x$) compounds, resulting in non-uniform degradation of the surface and/or edge properties of the BP layer.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A and 2B show a flow chart of a method of fabricating the semiconductor devices of FIGS. 1A and 1B, according to some embodiments.

DETAILED DESCRIPTION

Figure 1A:
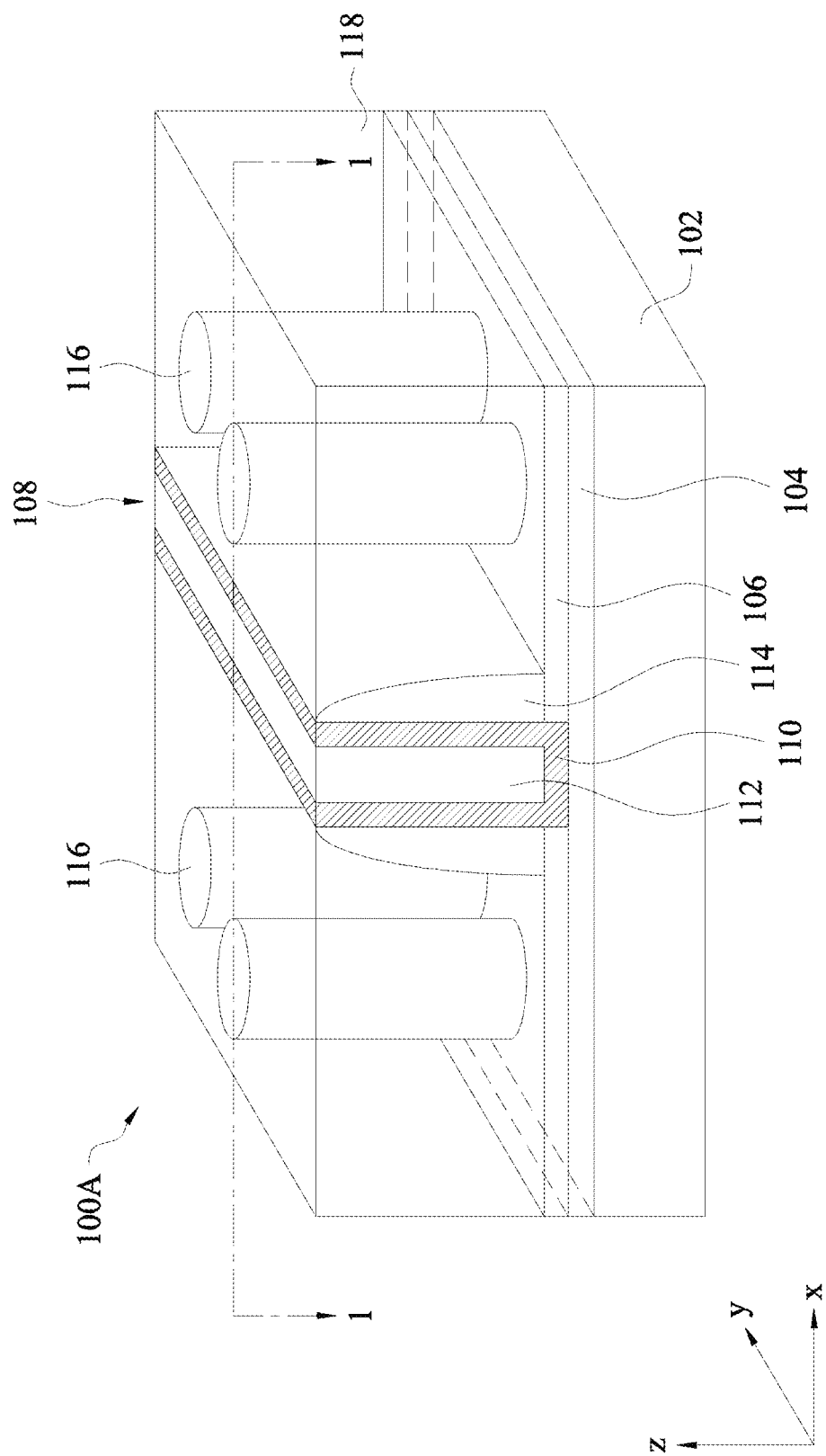
FIG. 1A is a perspective view of a planar FET having a BP channel, constructed according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices. More particularly, it is related to semiconductor devices having a black phosphorus (BP) layer for field-effect transistor (FET) channels and the methods of making the same. The term "BP layer" as used herein refers to one layer of phosphorene or multiple layers of phosphorene. An object of the present disclosure is to prevent non-uniform degradation of the surface and/or edge properties of a BP layer during fabrication. According to some embodiments, the surface and/or edges of the BP layer are passivated throughout the process flow during the fabrication.

Figure 1B:
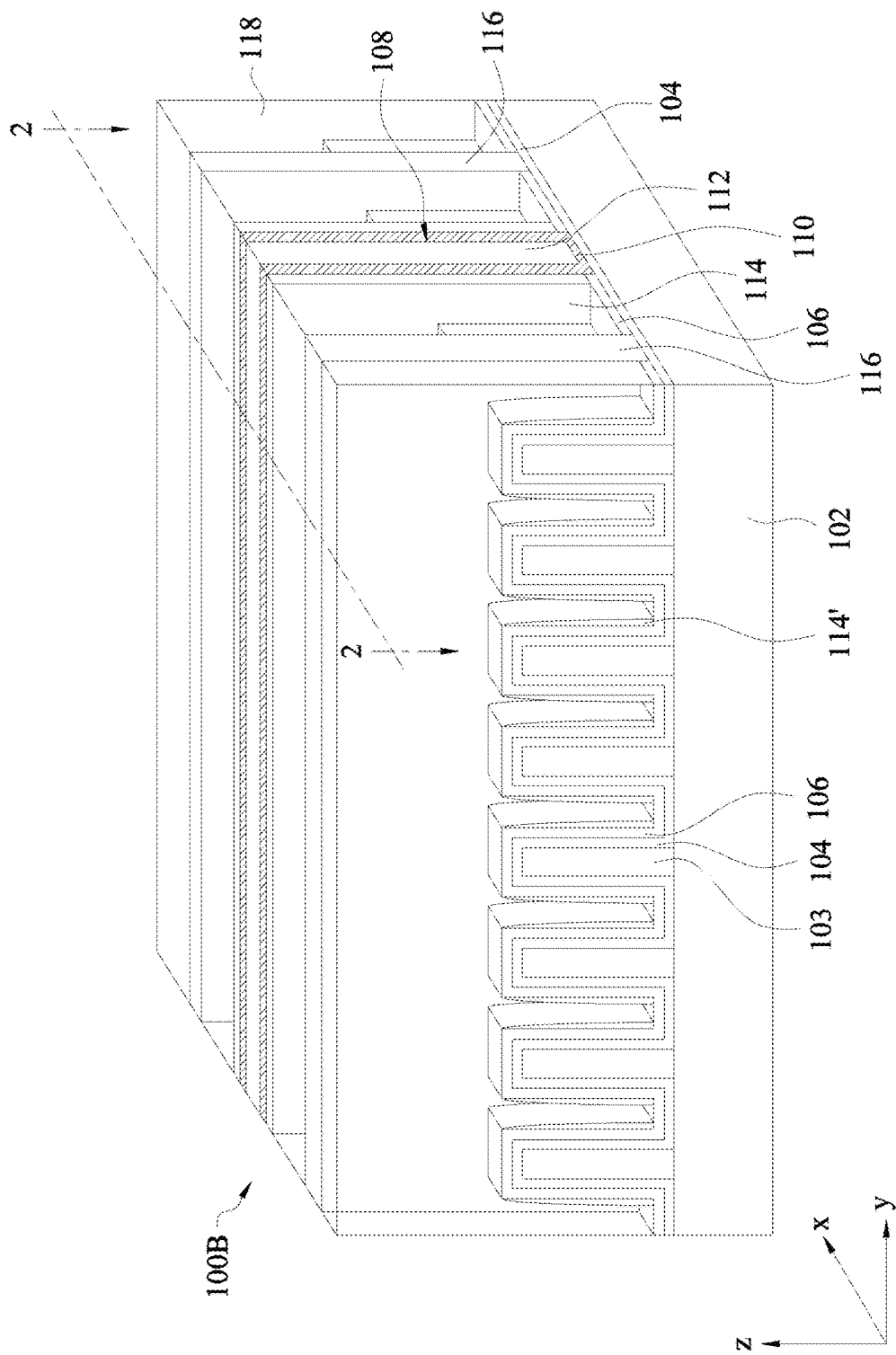
FIG. 1B is a perspective view of a multi-gate FET having fin-like BP channels, constructed according to various aspects of the present disclosure.
Figure 1C:
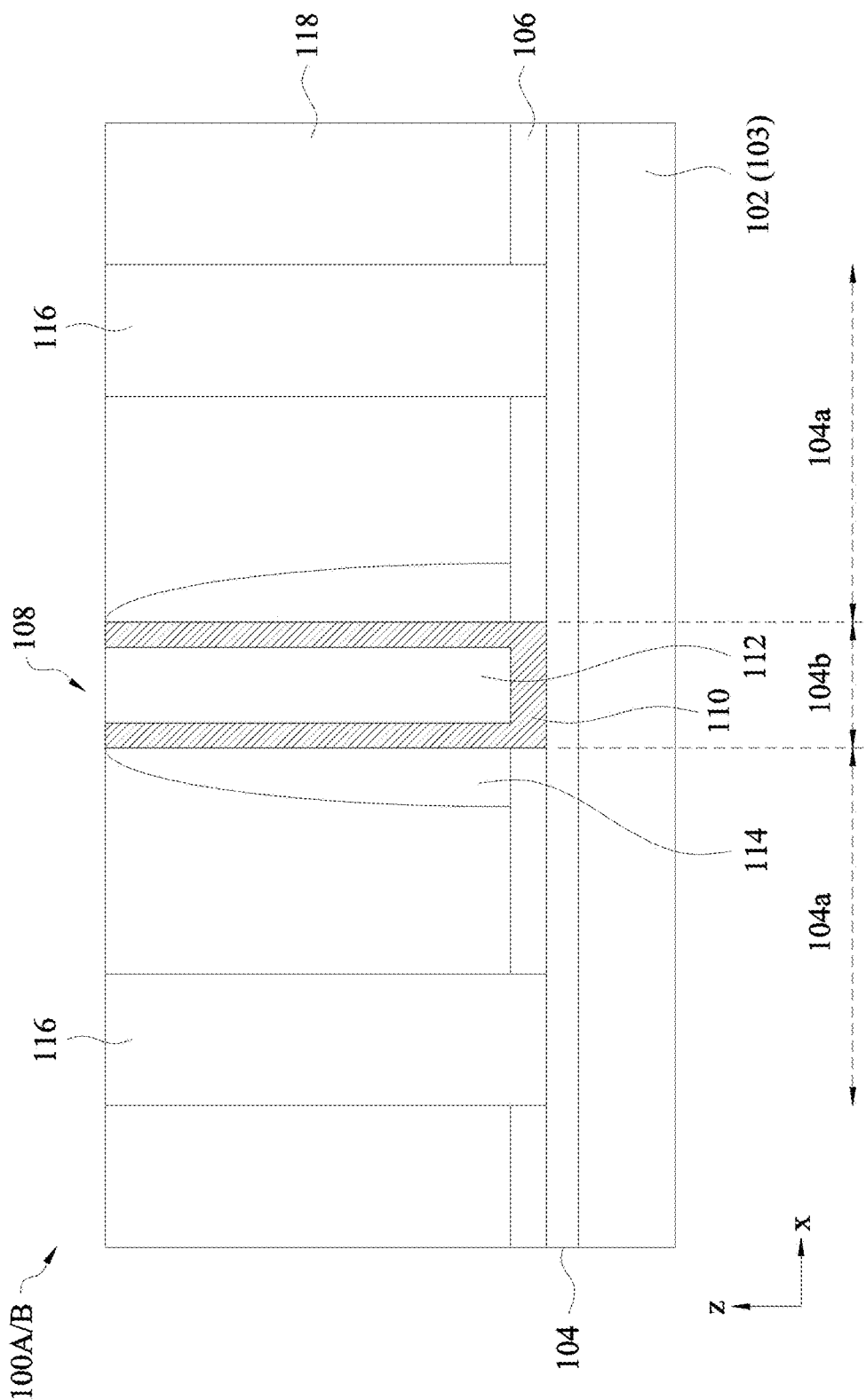
FIG. 1C is a cross-sectional view of the devices in FIGS. 1A and 1B, according to some embodiments.

FIG. 1A shows a perspective view of a FET 100A having a planar BP channel, and FIG. 1B shows a perspective view of a FET 100B having a fin-like BP channel. Both devices 100A and 100B are constructed according to various aspects of the present disclosure. FIG. 1C shows a cross-sectional view of the FET 100A (along the "1-1" line of FIG. 1A) and the FET 100B (along the "2-2" line of FIG. 1B) in the same figure for the purpose of simplicity, where the label "102

"(103)" in FIG. 1C and other figures refers to the feature "102" in FIG. 1A and the feature "103" in FIG. 1B collectively.

Referring to FIGS. 1A and 1C collectively, the FET 100A includes a substrate 102, a BP layer 104 over the substrate 102, a passivation layer 106 over the BP layer 104, a gate stack 108, and source and drain (S/D) contacts 116.

In embodiments, the substrate 102 includes a layer of insulating material and the BP layer 104 is formed on the surface of the insulating layer. In an embodiment, the insulating layer comprises silicon oxide. In another embodiment, the insulating layer comprises a crystalline oxide such as aluminum oxide.

The BP layer 104 includes one or multiple phosphorene, and provides two source and drain (S/D) regions 104a and a channel region 104b between the two S/D regions 104a. The orientation of the source-to-drain direction of the FET 100A is in the direction of the light effective mass of the phosphorene (the "x" direction), while the transverse in-plane direction is in the direction of the heavy effective mass of the phosphorene (the "y" direction).

The passivation layer 106 is in direct contact with the BP layer 104. In the present embodiment, the passivation layer 106 provides multiple openings through which the gate stack 108 and the S/D contacts 116 come in direct contact with the BP layer 104 at the channel region 104b and the S/D regions 104a respectively.

The gate stack 108 includes a gate dielectric layer 110 and a gate electrode 112 over the gate dielectric layer 110. The gate dielectric layer 110 and the passivation layer 106 may be of the same or different material. In an alternative embodiment, the gate stack 108 includes the gate electrode 112 but does not include the gate dielectric layer 110. To further this embodiment, a portion of the passivation layer 106 directly underneath the gate electrode 112 is not removed and functions as the gate dielectric layer.

In the present embodiment, the FET 100A further includes a gate spacer 114 on opposite sides of the gate stack 108, and an inter-layer dielectric (ILD) layer 118 over the passivation layer 106 and filling the spaces among the features 108, 114, and 116. In an alternative embodiment, the FET 100A does not include the gate spacer 114. The channel region 104b is directly underneath the gate dielectric layer 110 while the other portions of the BP layer 104 are the S/D regions 104a including S/D extensions underneath the gate spacer 114.

Referring to FIGS. 1B and 1C collectively, similar to the FET 100A, the FET 100B also includes a substrate 102, a BP layer 104 over the substrate 102, a passivation layer 106 over the BP layer 104, a gate stack 108, source and drain (S/D) contacts 116, a gate spacer 114, and an ILD layer 118. One difference between the FETs 100A and 100B is that the substrate 102 of the FET 100B provides a non-planar insulating surface on which the various features are formed. In the present embodiment, the non-planar insulating surface comprises a plurality of fins or bars 103. The fins 103 include a dielectric material, such as silicon oxide. The BP layer 104 and the passivation layer 106 are formed conformally over the fins 103. The gate stack 108 and the S/D contacts 116 engage multiple surfaces (e.g., the top and two sidewall surfaces) of the BP layer 104, forming a multi-gate transistor. A fin spacer 114' is disposed over sidewalls of the passivation layer 106. The fin spacer 114' includes the same material(s) as the gate spacer 114.

In various embodiments, each of the FETs 100A and 100B may be an intermediate device fabricated during processing of an integrated circuit (IC), or a portion thereof, that may comprise static random access memory (SRAM) and/or other logic circuits, passive components such as resistors, capacitors, and inductors, and active components such as p-type FETs, n-type FETs, metal-oxide semiconductor field effect transistors (MOSFET), complementary metal-oxide semiconductor (CMOS) transistors, bipolar transistors, high voltage transistors, high frequency transistors, other memory cells, and combinations thereof. More details about the FETs 100A and 100B, including the materials used therein and the methods of forming the same, are collectively described below.

Figure 2A:
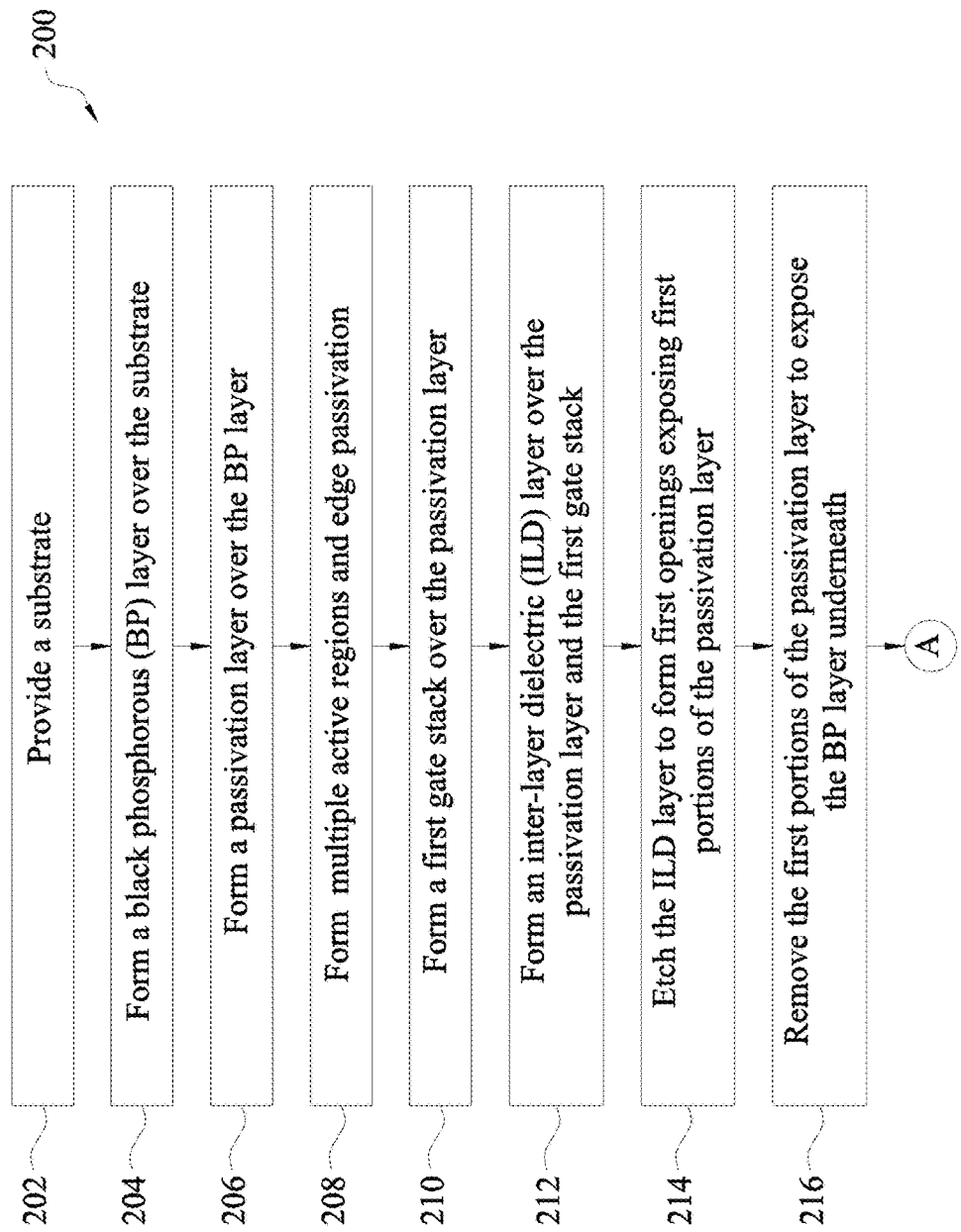

FIGS. 2A and 2B show a flow chart of a method 200 of forming a transistor having a BP channel, such as the FETs 100A and 100B, according to various aspects of the present disclosure. The method 200 is merely an example, and is not intended to limit the present disclosure beyond what is explicitly recited in the claims. Additional operations can be provided before, during, and after the method 200, and some operations described can be replaced, eliminated, or moved around for additional embodiments of the method. The method 200 is discussed in conjunction with FIGS. 3-7B and 8-17 which depict cross-sectional views of the FETs 100A and 100B collectively, and FIG. 7A which depicts a perspective view of the FET 100A. The label 100A/B in the figures refers to both the FET 100A and the FET 100B.

Figure 3:
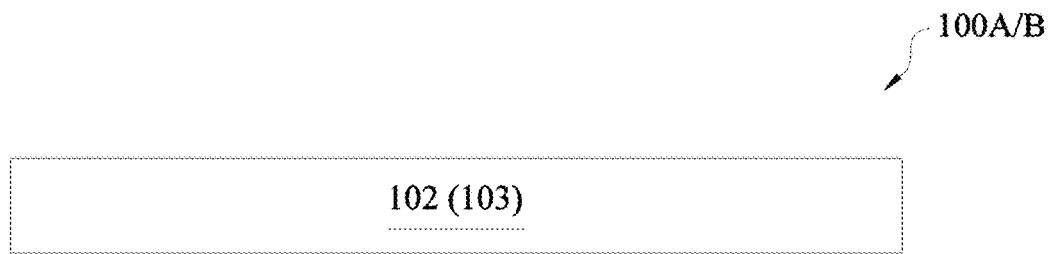
FIGS. 3, 4, 5, 6, 7B, 8, 9, 10, 11, 12, 13, 14, 15, 16, and 17 are cross-sectional views of forming a semiconductor device according to the method of FIGS. 2A and 2B, in accordance with some embodiments.

At operation 202, the method 200 (FIG. 2A) provides a substrate 102. Referring to FIG. 3, in embodiments, the substrate 102 is an insulator or a wafer. In an embodiment, the substrate 102 includes a dielectric layer that provides a planar top surface. The dielectric layer may comprise silicon oxide ($SiO_2$) or another crystalline oxide such as aluminum oxide ($Al_2O_3$). The dielectric layer may also comprise an amorphous dielectric material. In another embodiment, the dielectric layer provides a topography such as fins (or bars) 103 (FIG. 1B). The fins 103 may comprise a dielectric or insulating material which may be amorphous or crystalline in nature, such as $SiO_2$, $Al_2O_3$, or any other dielectric materials. The fins 103 may be parallel to each other, as illustrated in FIG. 1B, or may be perpendicular, or neither parallel or perpendicular to each other. In the present embodiment, the fins 103 are parallel to each other. The width of the fins 103 may be less than 10 nm, such as less than 5 nm.

Figure 4:
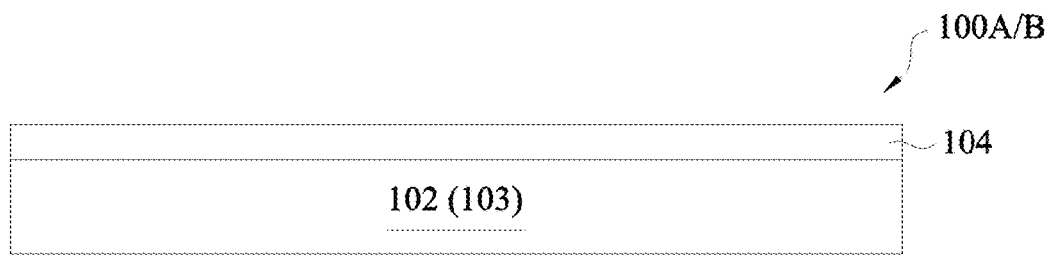

At operation 204, the method 200 (FIG. 2A) forms a BP layer 104 over the substrate 102, which includes the fins 103 in some embodiments. Referring to FIG. 4, The BP layer 104 can be formed by various techniques. For example, orthorhombic black phosphorus can be grown by a short-way transport reaction from red phosphorus and tin/tin-iodide as a mineralization additive. In another example, black phosphorus can be synthesized from white phosphorus under high pressure (13,000 kg/cm$^2$) at a temperature of about 200 degrees Celsius. The thickness of the BP layer 104 can be controlled by the deposition time. In embodiments, the thickness of the BP layer 104 may range from 1 monolayer to 20 monolayers (about 10.6 nm), such as from 1 monolayer to 10 monolayers (about 5.3 nm). The period (or spacing) between two layers of the black phosphorus is about 0.53 nm.

The BP layer 104 may be formed over the entire substrate 102 or selectively on parts of the substrate 102. If the BP layer 104 is formed over the entire substrate 102, it may be separated into different regions for forming different devices. This is performed in a later step to be discussed. The BP layer 104 is formed either as a planar layer as shown in FIG. 1A or conformally on the surfaces of the fins 103 as shown in FIG. 1B.

Figure 5:
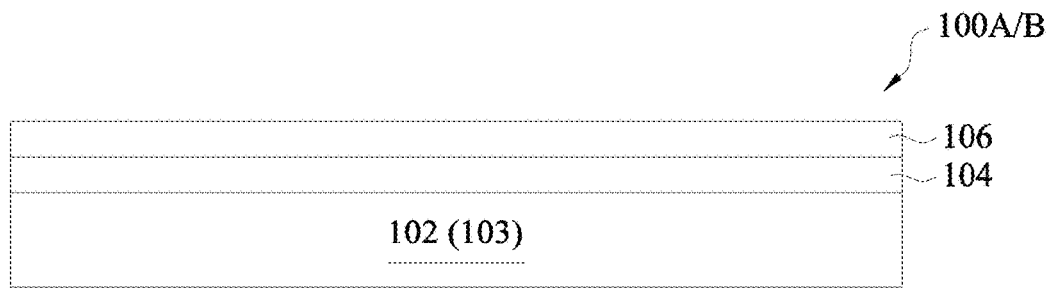
Figure 5:
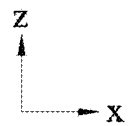

At operation 206, the method 200 (FIG. 2) forms a passivation layer 106 over the BP layer 104. Referring to FIG. 5, the passivation layer 106 covers the entire surface of the BP layer 104, either as a planar layer or a conformal layer over the topography of the substrate 102. In the present embodiment, the passivation layer 106 is formed without breaking vacuum subsequent to the formation of the BP layer 104. This is to prevent the BP layer 104 from being exposed to excessive moisture and ambient air. In various embodiments, partial pressures of the moisture and oxygen are reduced to 0.1 torr or lower during the operations 204 and 206.

Figure 18:
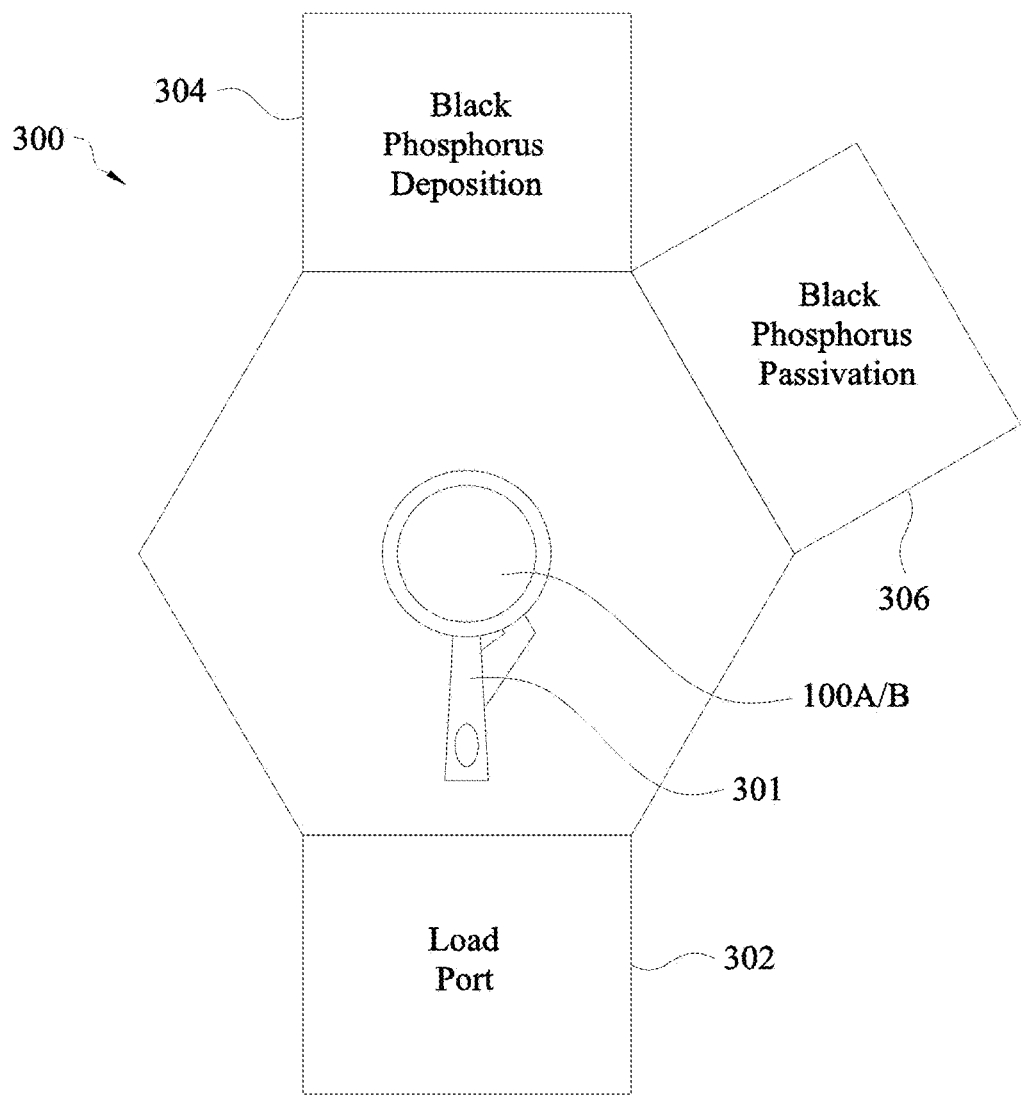
FIGS. 18 and 19 are schematic views of manufacturing tools for fabricating the semiconductor devices of FIGS. 1A and 1B, according to some embodiments.
Figure 19:
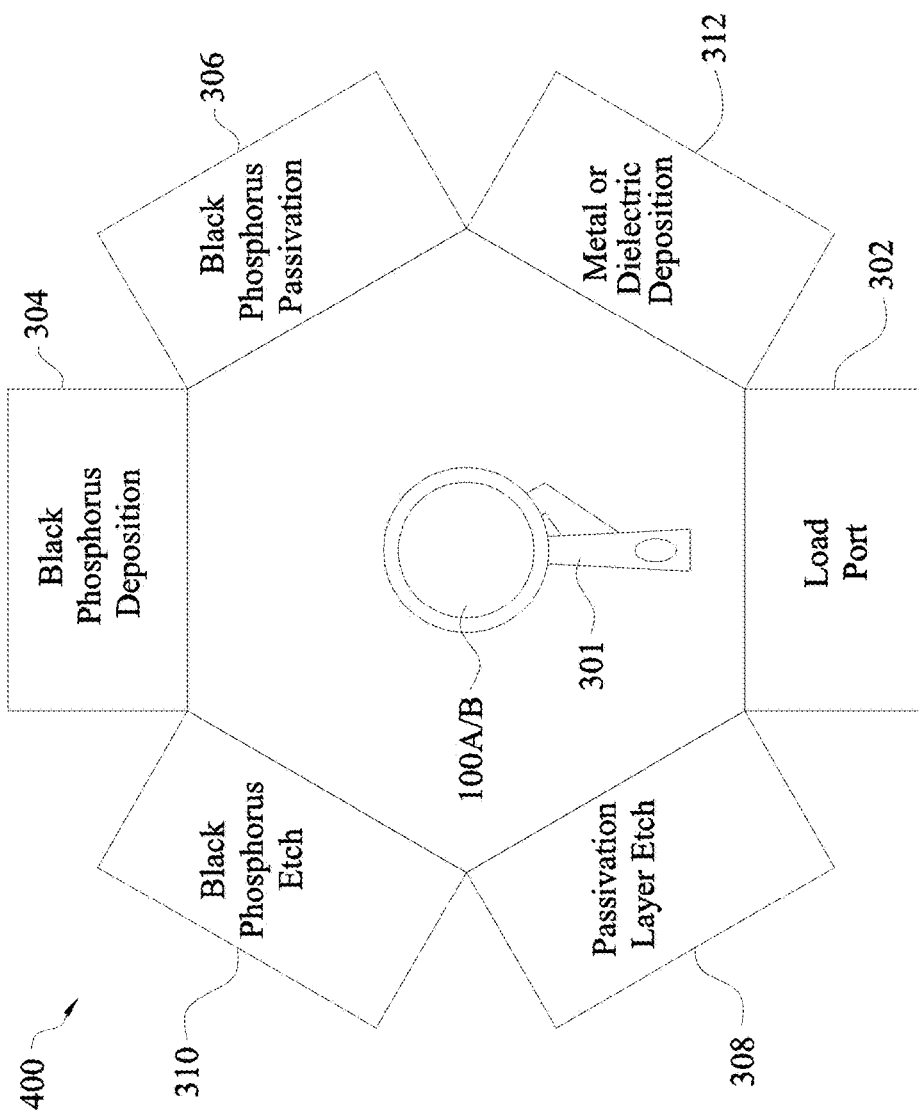

In an embodiment, operations 204 and 206 are performed within a multi-chamber tool such as a multi-chamber tool 300 in FIG. 18 or a multi-chamber tool 400 in FIG. 19. Referring to FIG. 18, the tool 300 includes a black phosphorus deposition chamber 304 and a black phosphorus passivation chamber 306. The BP deposition chamber 304 and the BP passivation chamber 306 share one load port 302. Once the device 100A/B is loaded into the tool 300 through the load port 302, it is processed in multiple chambers before it is unloaded (transferred out) from the tool 300. A transfer module 301 (e.g., a mechanical arm or a robot) is operable to move the device 100A/B among the chambers. Throughout the multi-chamber processing, a general vacuum environment is maintained in the tool 300. For example, after the BP layer 104 is formed in the chamber 304, the transfer module 301 moves the device 100A/B from the chamber 304 to the chamber 306 without breaking vacuum. Then, the passivation layer 106 is formed over the BP layer 104 in the chamber 306. Referring to FIG. 19, the tool 400 also includes a BP deposition chamber 304 and a BP passivation chamber 306 as discussed above. The tool 400 further includes a passivation layer etch chamber 308, a black phosphorus etch chamber 310, and a metal or dielectric deposition chamber 312. The functions of the various chambers will be described later. The chambers 304, 306, 308, 310, and 312 share one load port 302. A transfer module 301 is operable to move the device 100A/B among the chambers without breaking vacuum. In embodiments, the tools 300 and 400 may each include multiple load ports 302 and multiple transfer modules 301, for example, to be able to process multiple wafers at the same time. Various other embodiments of multi-chamber tools can be used by the method 200.

In an embodiment, operation 206 includes depositing an ultra-thin film of metal over the BP layer 104 without breaking vacuum subsequent to the formation of the BP layer 104, and then oxidizing the film of metal. The metal film can be formed by physical vapor deposition (PVD) or sputtering. To further this embodiment, the BP passivation chamber 306 may comprise a vacuum compartment defined by chamber walls, a pedestal for holding the device 100A/B, and a PVD target comprising the material to be sputtered. A processing gas such as argon may be supplied to the chamber 306 at a low pressure (maintained by a vacuum pump), and metered by a mass flow controller. A DC power supply may be used to negatively bias the PVD target with respect to the device 100A/B. Radio frequency coil power may be inductively coupled into the chamber 306 by an inductive coil to create a plasma. The ionized gas impinges on the target with sufficient energy to dislodge atoms or multi-atom particles for deposition on the device 100A/B. In embodiments, the metal film is deposited to a thickness of about 0.5 nm or greater. When the device 100A/B comprising the metal film on the BP layer 104 is taken out of the multi-chamber tool 300 (or the tool 400), the metal film is sacrificially oxidized in air and becomes the passivation layer 106, without oxidizing the BP layer 104. In an embodiment, the metal film comprises aluminum. But this is not limiting. In general, the metal may be one that is easily oxidized in air, such as hafnium (Hf) and zirconium (Zr). Further, the metal should not react spontaneously with phosphorene at the deposition temperature, which may range from 10 to 250 degrees Celsius. In another embodiment, the metal film may be oxidized under controlled conditions, such as in a chamber with oxygen, oxygen-containing gas, or water vapor. The chamber that oxidizes the metal layer may be in the same tool as the chamber 306.

In another embodiment, operation 206 includes depositing a dielectric layer as the passivation layer 106 without breaking vacuum subsequent to the formation of the BP layer 104. In a further embodiment, the passivation layer 106 comprises an aluminum oxide ($Al_2O_3$) layer formed by atomic layer deposition (ALD). In a further alternative embodiment, the passivation layer 106 may comprise a dielectric material such as hafnium oxide ($HfO_2$), lanthanum oxide ($La_2O_3$), silicon oxide ($SiO_2$), boron nitride (BN), and zirconium oxide ($ZrO_2$). In these embodiments, the BP passivation chamber 306 is an ALD chamber and makes use of the self-limiting nature of surface reactions for thin film deposition. For example, to grow an $Al_2O_3$ passivation layer on the BP layer 104, alternating exposures of trimethlyaluminum (TMA) and $H_2O$ is performed in the chamber 306. In each cycle of TMA and $H_2O$ exposure, a monolayer of $Al_2O_3$ of about 0.11 to 0.12 nm is deposited. Before the cycling of TMA and $H_2O$, there may be multiple pulses of TMA and purge to ensure that a layer of Al first forms on the BP layer 104. The ALD may be performed at temperatures ranging from 150 to 350 degrees Celsius, for example.

In yet another embodiment, the passivation layer 106 comprises a semiconductor such as silicon, germanium, carbon, or their alloys, such as silicon-germanium-carbon. To further this embodiment, operation 206 includes depositing the semiconductor material over the BP layer 104 without breaking vacuum subsequent to the formation of the BP layer 104. The deposition may be a chemical vapor deposition using precursors such as $SiH_4$, $Si_2H_6$, $GeH_4$, $Ge_2H_6$, and $CH_4$.

Figure 6:
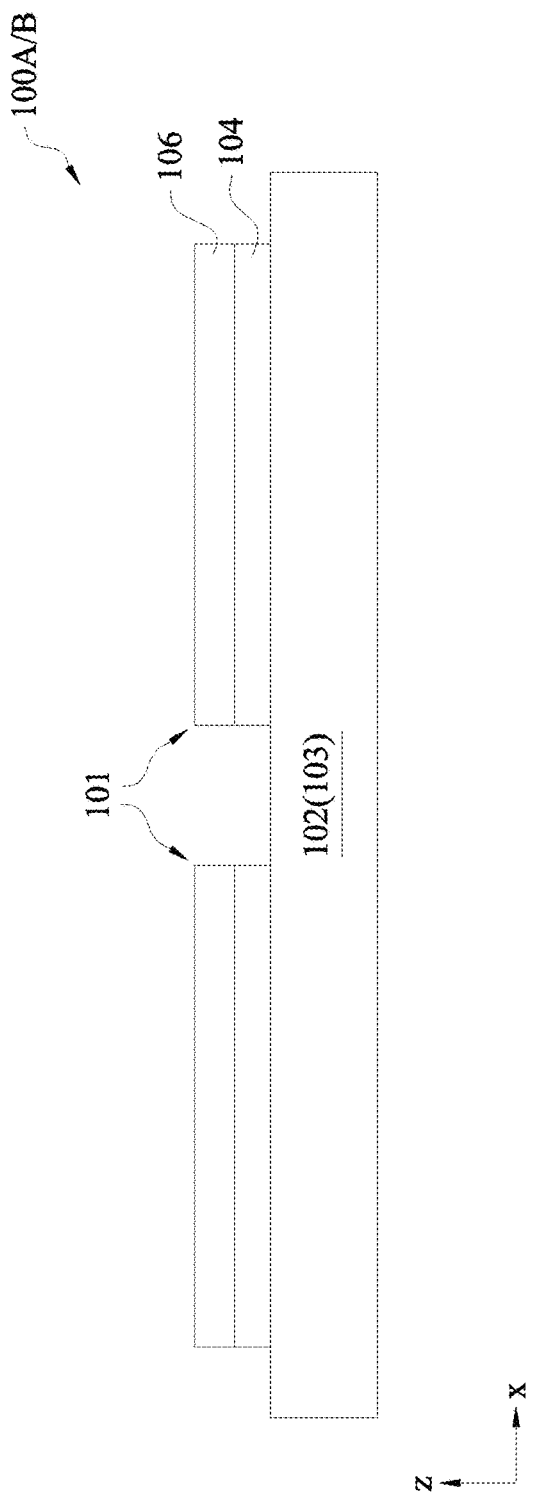

After operation 206, the device 100A/B comprises the BP layer 104 covered by the passivation layer 106. The two layers may cover the entire surface of the substrate 102, such as a wafer or portions thereof. In an embodiment where the layers 104 and 106 cover the entire surface of the substrate 102, the method 200 may further include an operation 208 of separating the BP layer 104 (and the passivation layer 106 thereon) into multiple active regions (or BP active regions) so that transistors, such as FETs 100A and/or 100B, may be formed in each active region. This is illustrated in FIG. 6 where two active regions 101 are formed by operation 208. Each of the active regions 101 includes a portion of the BP layer 104 underneath a portion of the passivation layer 106. In an embodiment, operation 208 includes one or more lithography processes followed by an etching process to define a plurality of active regions or islands of BP layers. The portions of the BP layer 104 and the passivation layer 106 outside the defined active regions are removed by the etching process. Each active region 101 may be further processed into one or more transistors after the etching. Some active regions 101 may be dummy regions for the purpose of ensuring good etching uniformity. The etching process may be a wet etch or a dry etch. The wet etch may comprise etching in water ($H_2O$) or diluted hydrofluoric acid (HF). The dry etch may be performed using an oxygen-containing plasma, or simply using water vapor. The reaction rate may be adjusted by tuning the temperature, pressure, and oxygen concentration. The dry etch may be performed in one or more etch chambers of a multi-chamber tool, such as the passivation layer etch chamber 308 and the BP etch chamber 310 of FIG. 19.

Figure 7A:
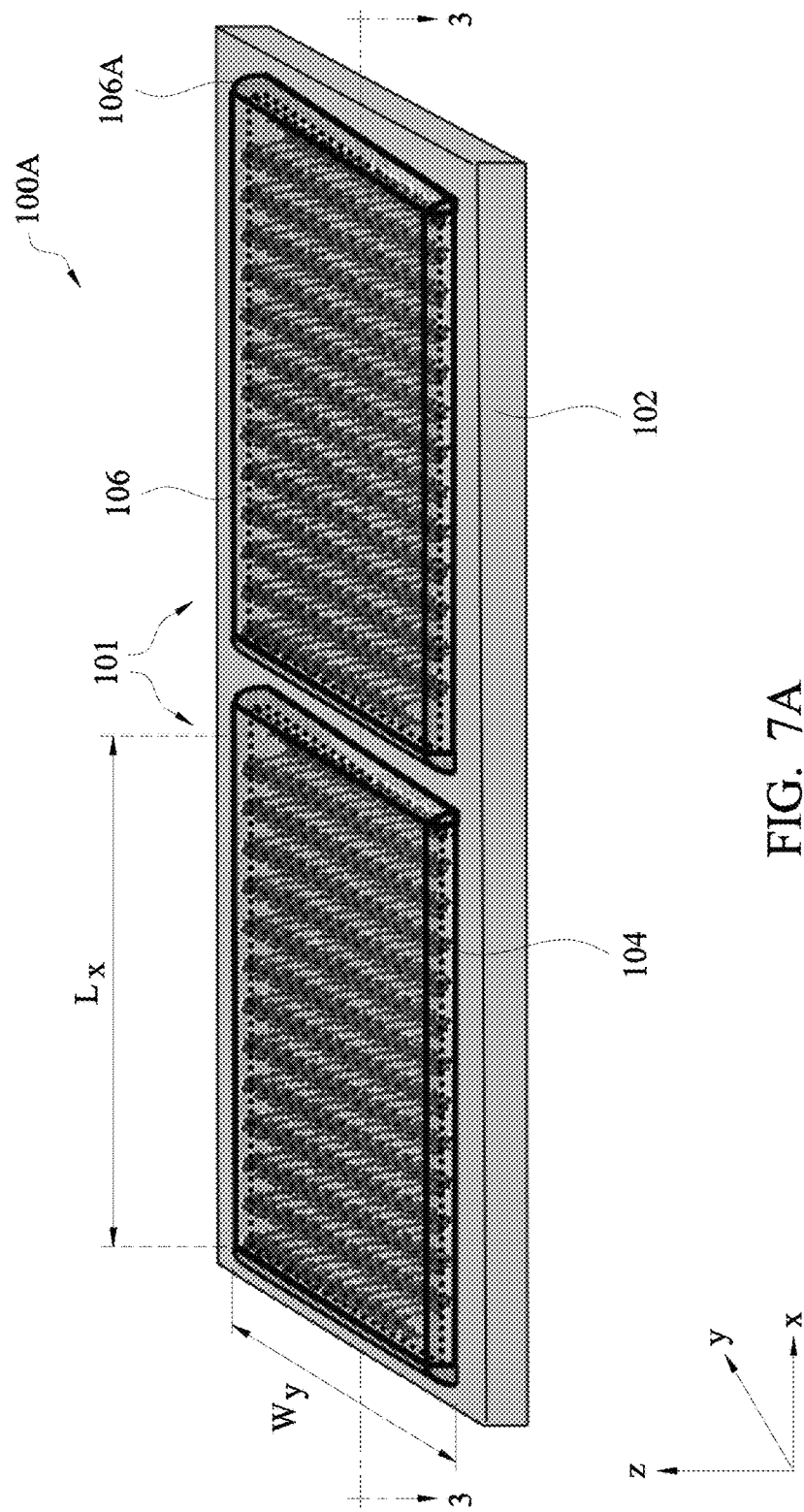
FIG. 7A is a perspective view of a device having multiple BP active regions.
Figure 7B:
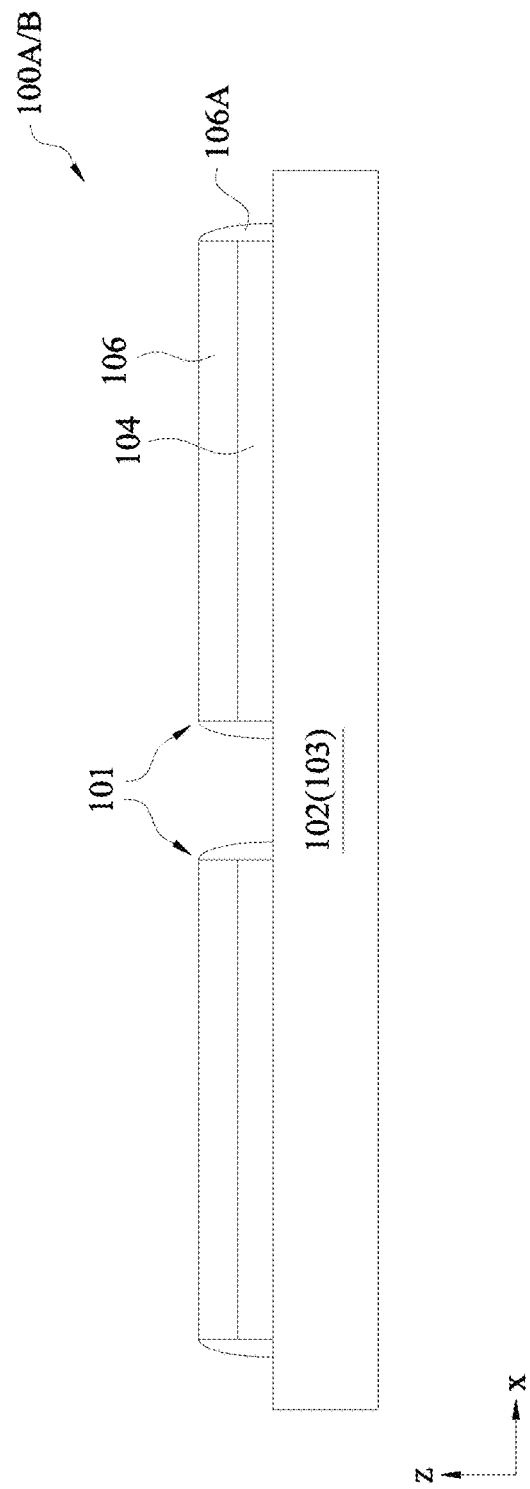

After the BP layer 104 and the passivation layer 106 are etched, some edges (sidewall surfaces in the "x-z" or "y-z" plane) of the BP layer 104 are no longer covered by the passivation layer 106. Operation 208 further includes an edge passivation process to cover those edges with a passivation layer 106A as shown in FIGS. 7A and 7B. FIG. 7A illustrates a perspective view of the device 100A, while FIG. 7B illustrates a cross-sectional view of the device 100A along the 3-3 line of FIG. 7A. Although a perspective view of the device 100B at this fabrication stage is not illustrated, person having ordinary skill in the art can derive it based on the present disclosure. In that regard, FIG. 7B also illustrates a cross-sectional view of the device 100B at this fabrication stage. The edge passivation process may employ techniques similar to the surface passivation as described earlier with respect to operation 206. In a first embodiment of the edge passivation process, an ultra-thin layer of aluminum is deposited (at least 0.5 nm) and is subsequently oxidized. In a second embodiment of the edge passivation process, an edge passivation layer of a dielectric material such as $Al_2O_3$ is deposited by ALD. Other embodiments of edge passivation are within the scope of the present disclosure.

In an embodiment as shown in FIGS. 7A and 7B, operation 208 results in multiple BP active regions 101 over the substrate 102. Each BP active region 101 includes a portion of the BP layer 104 covered by a portion of the surface passivation layer 106 and portions of the edge passivation layer 106A. The multiple BP active regions 101 may be spaced apart from each other by less than 20 nm, such as less than 5 nm. Each BP active region 101 may have a length $L_x$ in the "x" direction ranging from 10 nm to more than 1 micrometer, such as from 20 nm to 100 nm, and have a width $W_y$ in the "y" direction as small as several nanometers, such as from 2 nm to 20 nm. Each BP active region 101 may take the shape of a rectangle, or another geometric or polygonal shape. Further, the number of phosphorene layers in different active regions 101 may be the same or different. For example, one BP active region 101 may have two phosphorene layers, while another BP active region 101 may have three phosphorene layers. This provides improved design flexibility as the number of stacked phosphorene layers in a BP active region 101 determines the band gap of the BP active regions 101, which in turn affects various electrical characteristics of the resultant transistor such as threshold voltage and on-state and off-state currents. In various embodiments, the number of phosphorene layers in two BP active regions 101 may be the same or different. Further, each BP active region 101 may include any number of phosphorene layers. In the following discussion, FIGS. 1A, 1B, 1C, and 8-17 illustrate one transistor formed in one BP active region 101.

Figure 8:
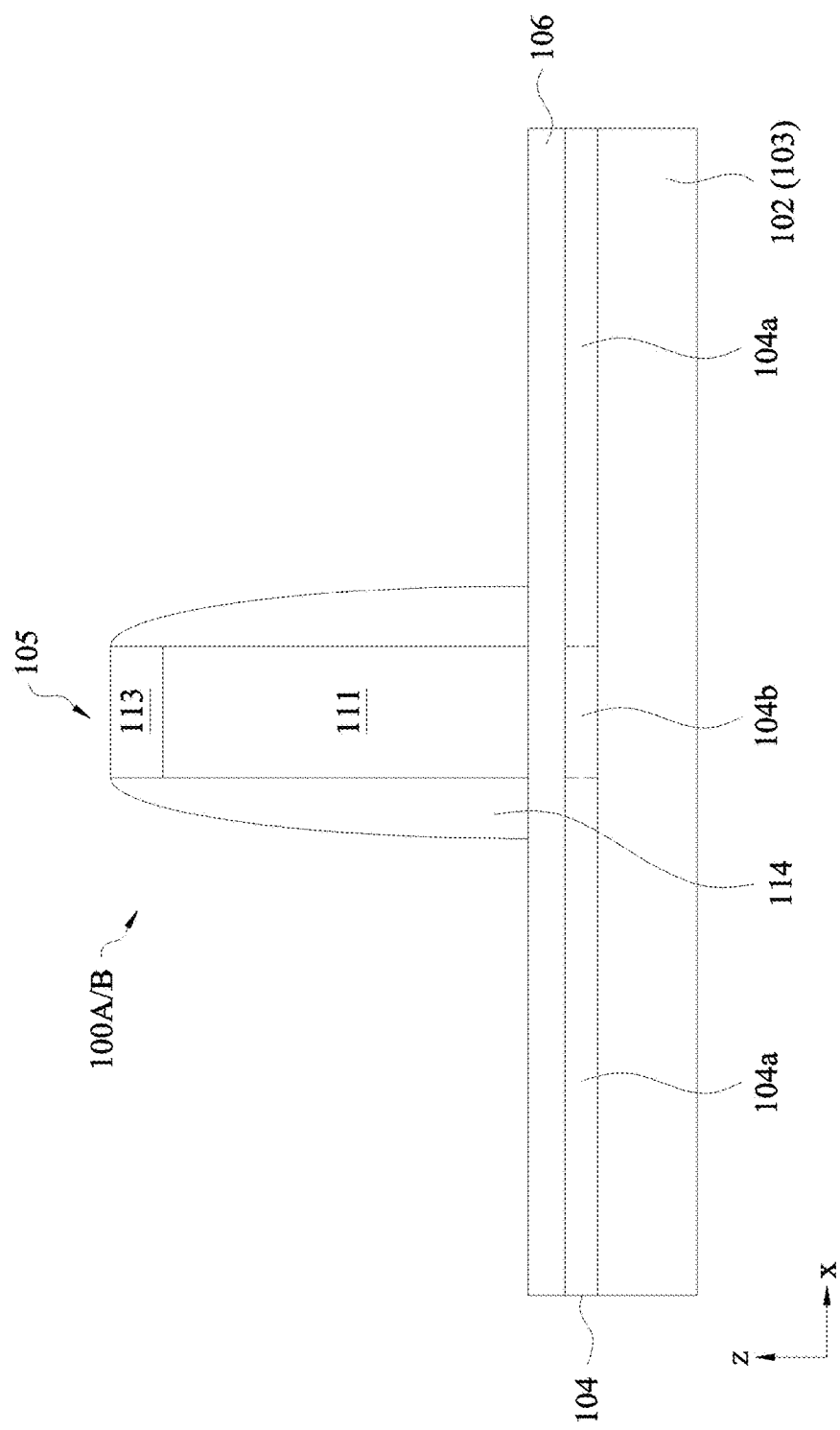

At operation 210, the method 200 (FIG. 2A) forms a gate stack 105 over the passivation layer 106. Referring to FIG. 8, the gate stack 105 is formed over the passivation layer 106 and over the channel region 104b. In the present embodiment, the gate stack 105 is a dummy gate stack and will be replaced by a final gate stack 108 (FIGS. 1A and 1B). In another embodiment, the gate stack 105 is the final gate 108. To further this embodiment, a portion of the passivation layer 106 underneath the gate stack 105 may be used as a gate dielectric layer.

In the present embodiment, the dummy gate stack 105 includes a dummy electrode layer 111 over the passivation layer 106 and a hard mask layer 113 over the dummy electrode layer 111. The dummy electrode layer 111 may comprise poly-crystalline silicon (poly-Si) and may be formed by suitable deposition processes such as low-pressure chemical vapor deposition (LPCVD) and plasma-enhanced CVD (PECVD). The thickness (along the "z" direction) of the dummy gate electrode 111 may range from 10 nm to 100 nm. An optional dummy gate dielectric layer (e.g., a layer of silicon oxide) may be deposited on the passivation layer 106 prior to the deposition of the dummy gate electrode 111. The hard mask layer 113 may include one or more layers of material such as silicon oxide and/or silicon nitride and is formed by deposition processes. In an embodiment, after the layers of materials are deposited over the passivation layer 106, one or more lithography and etching processes are performed to form the dummy gate stack 105. A gate spacer 114 is optionally formed adjacent to the dummy gate stack 105. The gate spacer 114 may be formed by chemical vapor deposition of $Si_3N_4$ followed by reactive ion etching, in one example.

Figure 9:
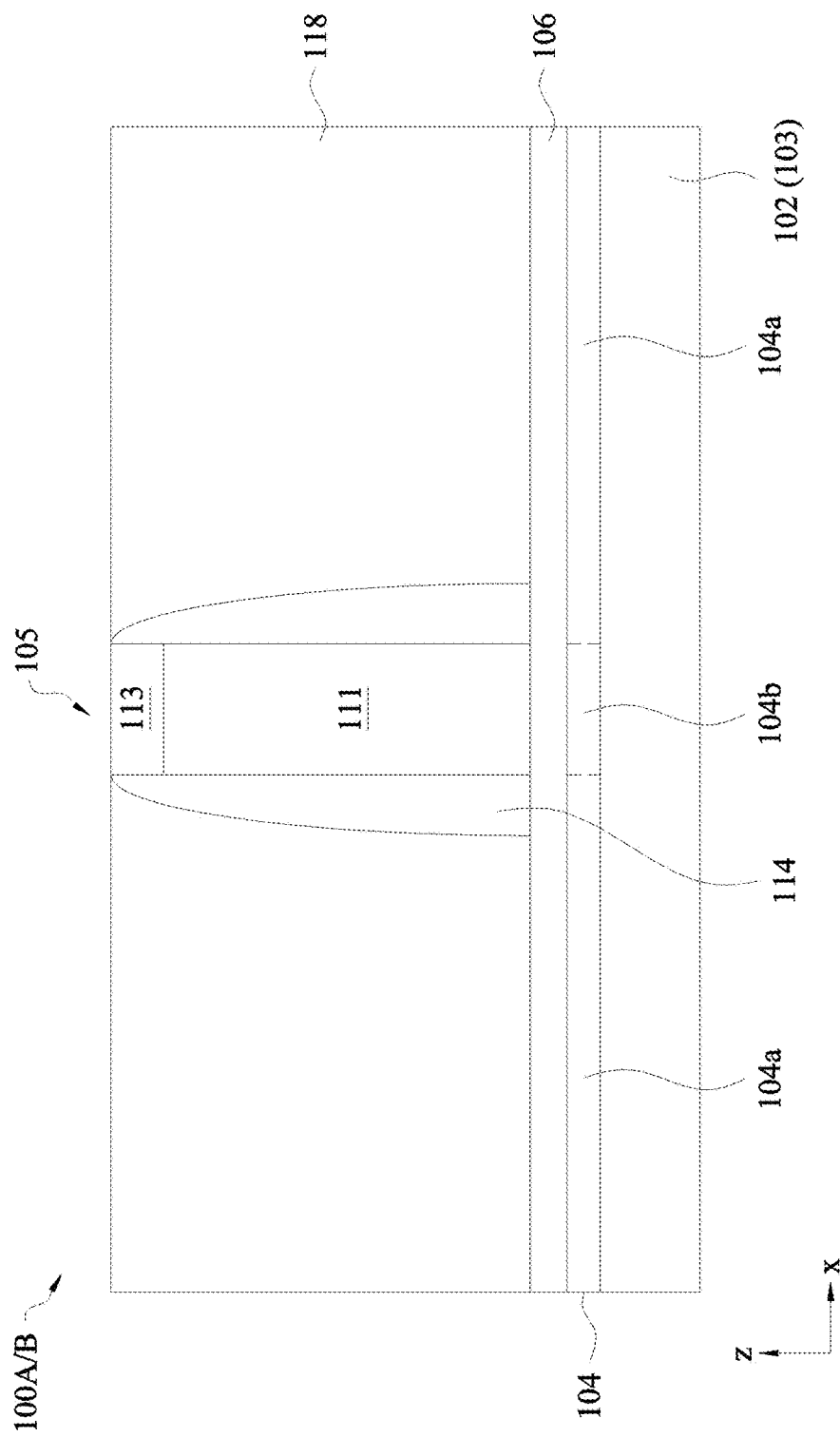

At operation 212, the method 200 (FIG. 2A) forms an inter-layer dielectric (ILD) layer 118 over the passivation layer 106 and the dummy gate stack 105. Referring to FIG. 9, the ILD layer 118 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 118 may be deposited by a PECVD process or other suitable deposition technique. In an embodiment, the ILD layer 118 is formed by a flowable CVD (FCVD) process. The FCVD process includes depositing a flowable material (such as a liquid compound) over the substrate 102 to fill various trenches, and converting the flowable material to a solid material by a suitable technique, such as thermal annealing or ultraviolet radiation. The ILD layer 118 is then etched back or planarized by a chemical mechanical planarization (CMP) process. The ILD layer 118 has a thickness equal to or greater than the height of the dummy gate stack 105. In an embodiment, a contact etch stop layer (CESL) may be formed underneath the ILD layer 118. The CESL may include silicon nitride, silicon oxynitride, silicon nitride with oxygen (O) or carbon (C) elements, and/or other materials.

Figure 10:
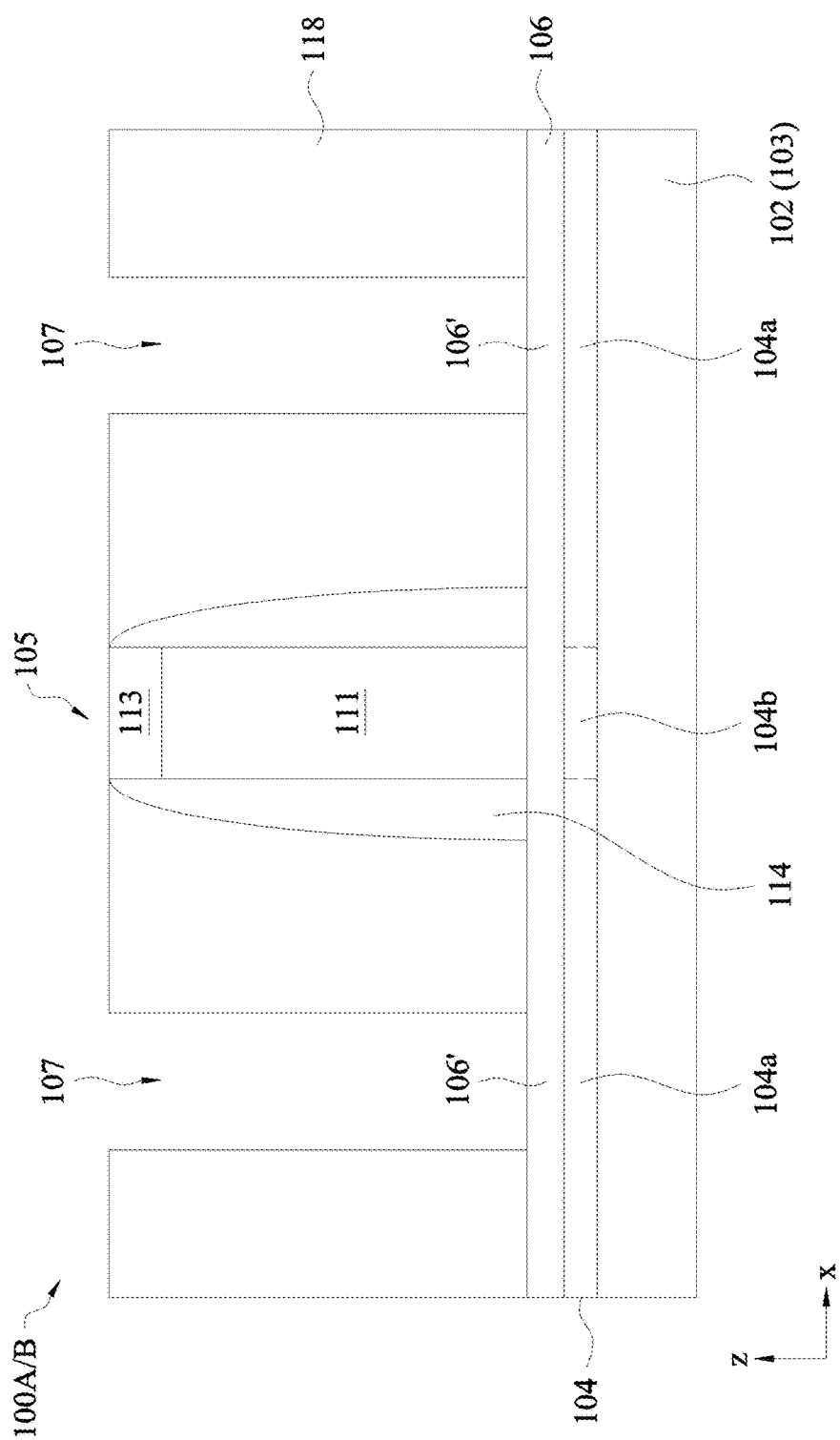

At operation 214, the method 200 (FIG. 2A) etches the ILD layer 118 to form openings (contact holes) 107. Referring to FIG. 10, the openings 107 expose first portions 106' of the passivation layer 106 over the S/D regions 104a. In embodiments, the openings 107 are formed by one or more photolithography and etching processes. For example, the photolithography process forms a hard mask and the device 100A/B is then etched through the hard mask. The etching process may include a suitable wet etch, dry (plasma) etch, and/or other processes. For example, a dry etching process may use chlorine-containing gases, fluorine-containing gases, other etching gases, or a combination thereof. The wet etching solutions may include $NH_4OH$, HF (hydrofluoric acid) or diluted HF, deionized water, TMAH (tetramethylammonium hydroxide), other suitable wet etching solutions, or combinations thereof. The etching process stops at the passivation layer 106.

Figure 11:
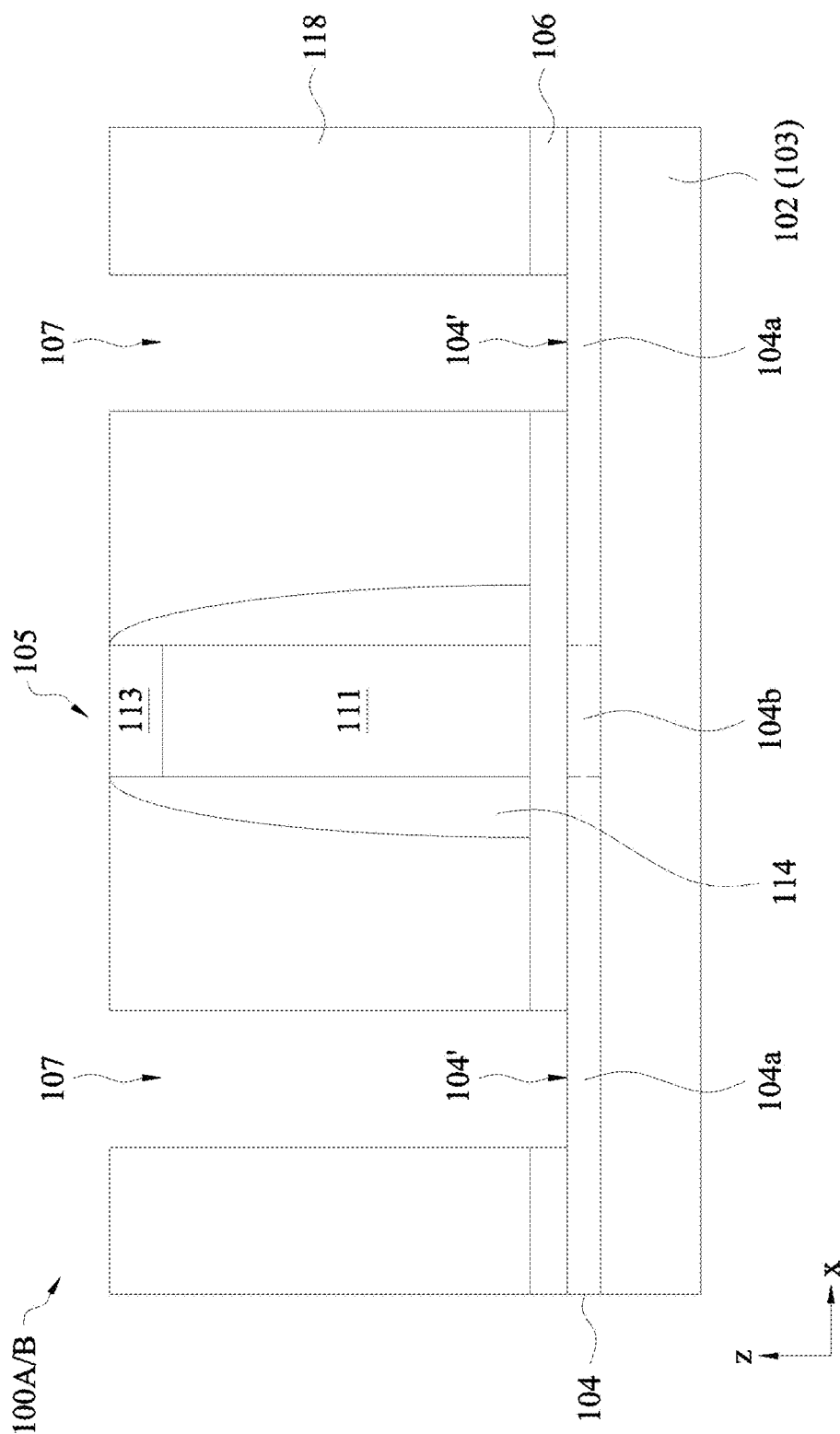

At operation 216, the method 200 (FIG. 2A) removes the first portions 106' of the passivation layer to expose the BP layer 104 underneath, as shown in FIG. 11. In the present embodiment, operation 216 is performed in an etch chamber of a multi-chamber tool, such as the chamber 308 of the tool 400 (FIG. 19). The etching process may be a wet etch or a dry etch. The wet etch may comprise etching in water ($H_2O$) or diluted hydrofluoric acid (HF). The dry etch may be performed using an oxygen-containing plasma, or simply using water vapor. The reaction rate may be adjusted by tuning the temperature, pressure, and oxygen concentration. The etching process exposes top surfaces 104' of the BP layer 104 in the S/D regions 104a.

Figure 12:
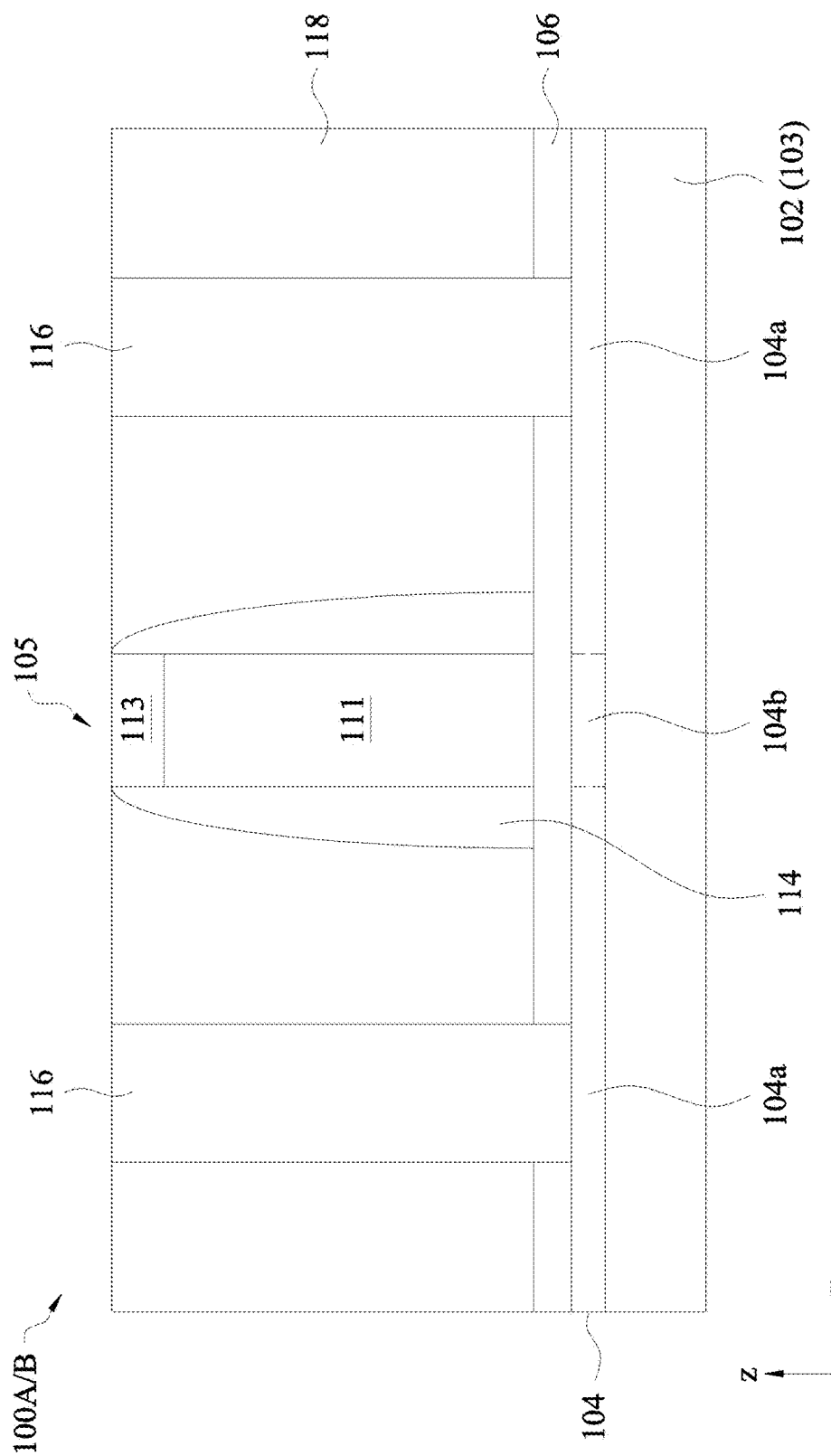

At operation 218, the method 200 (FIG. 2B) deposits a contact material 116 into the openings 107. Referring to FIG. 12, the contact material 116 fills the openings 107 and comes in direct contact with the BP layer 104 in the S/D regions 104a, thereby forming S/D contacts 116. In the present embodiment, operation 218 is performed without breaking vacuum subsequent to operation 216. In one example, operation 216 is performed in the chamber 308 of the tool 400 (FIG. 19). After the passivation layer 106 is etched and the BP layer 104 is exposed, the device 100A/B is transferred from the chamber 308 to the chamber 312 without breaking vacuum. This ensures that the top surfaces 104' of the BP layer 104 remain substantially free of oxidation. Subsequently, the contact material 116 is deposited into the openings 107 in the chamber 312. This may be a chemical vapor deposition process or a physical vapor deposition process. The contact material 116 is metallic in nature, and may be metallic nitrides, metallic or conductive oxides, elemental metals, or combinations thereof. The elemental metals may be selected from, but not limited to, the group consisting of Ti, V, Co, Ni, Zr, Mo, Tc, Rh, Pd, Hf, Ta, W, Re, Ir, and Pt. After the deposition of the contact material 116, a CMP process is performed to planarize the surface of the device 100A/B. In an embodiment, the FET 100A/B is a p-channel field-effect transistor, and the contact material 116 has a work function higher than about 4.5 eV. In another embodiment, the FET 100A/B is an n-channel field-effect transistor, and the contact material 116 has a work function lower than about 4.5 eV.

Figure 13:
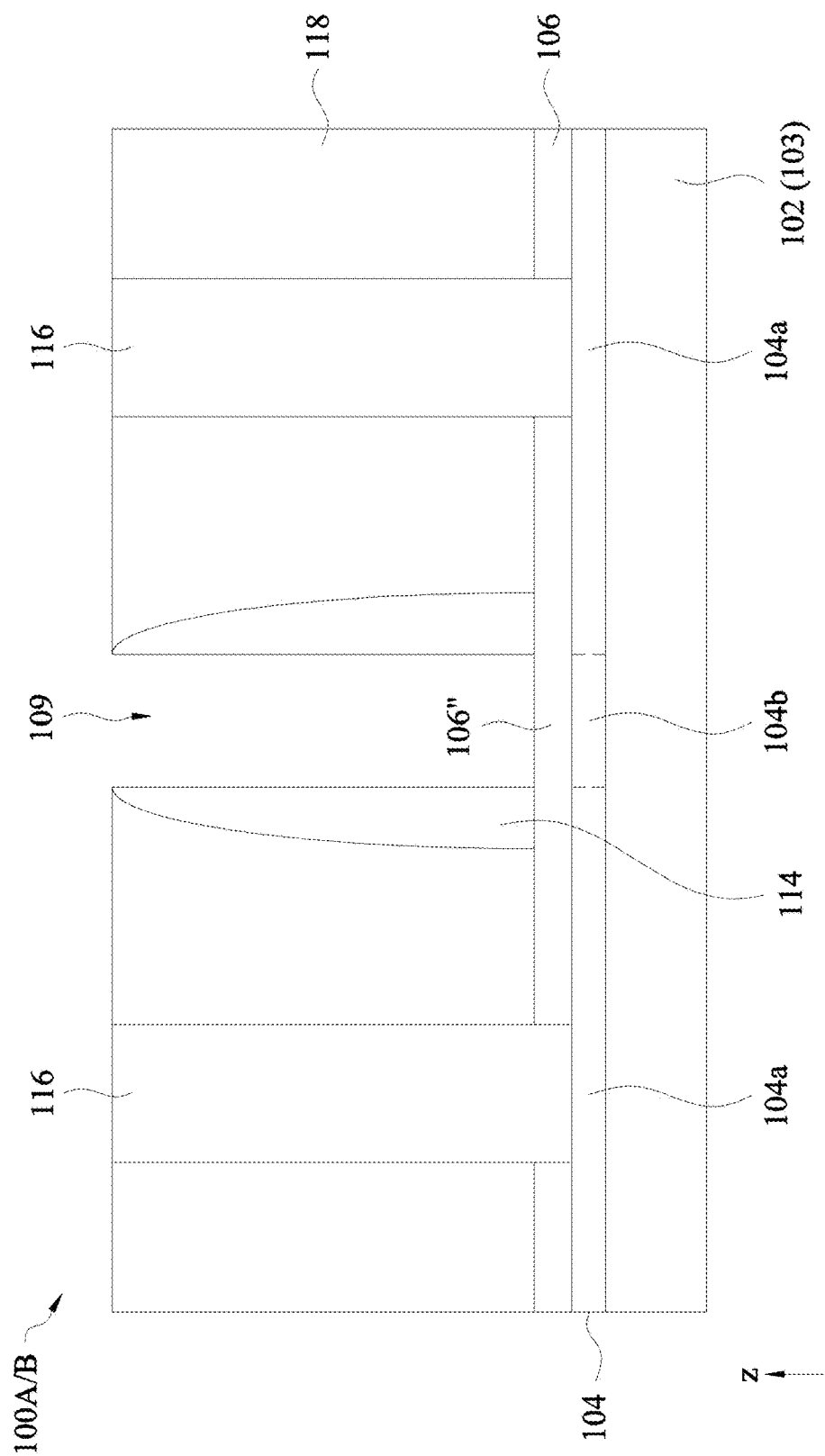

At operation 220, the method 200 (FIG. 2B) removes the dummy gate stack 105. Referring to FIG. 13, the dummy gate stack 105, including the hard mask layer 113 and the dummy gate electrode 111, is removed and an opening 109 is formed. The opening 109 exposes a second portion 106" of the passivation layer 106 over the channel region 104b. The dummy gate stack 105 may be removed by one or more etching processes that may include a wet etch, a dry etch, and/or other suitable etch techniques. The etching processes stop at the passivation layer 106.

Figure 14:
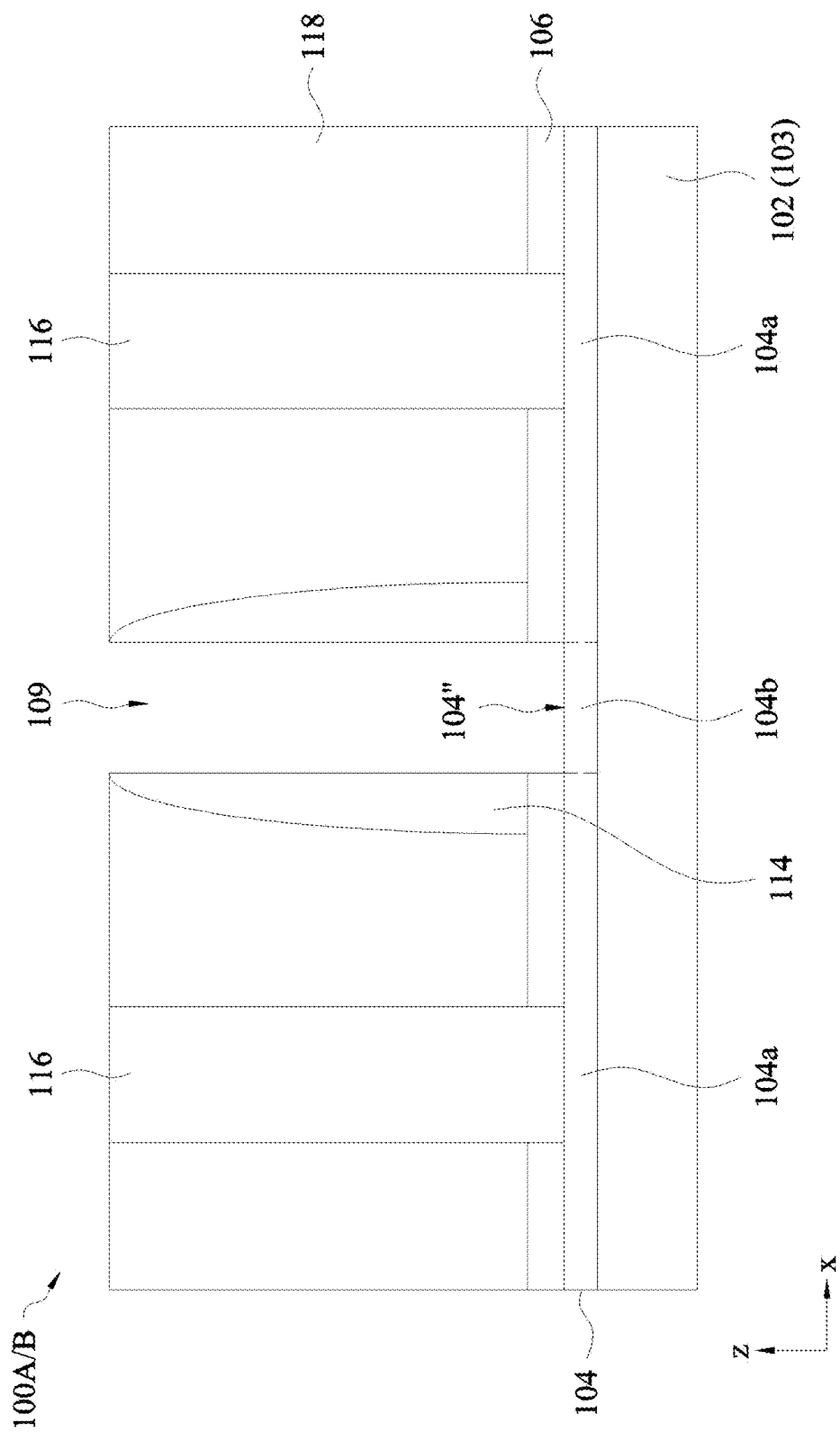

At operation 222, the method 200 (FIG. 2B) removes the second portion 106" of the passivation layer 106 to expose the BP layer 104 underneath, as shown in FIG. 14. In the present embodiment, operation 222 is performed in an etch chamber of a multi-chamber tool, such as the chamber 308 of the tool 400 (FIG. 19). This is similar to operation 216 discussed above. After the passivation layer 106 is etched, a top surface 104" of the BP layer 104 is exposed in the opening 109.

Figure 15:
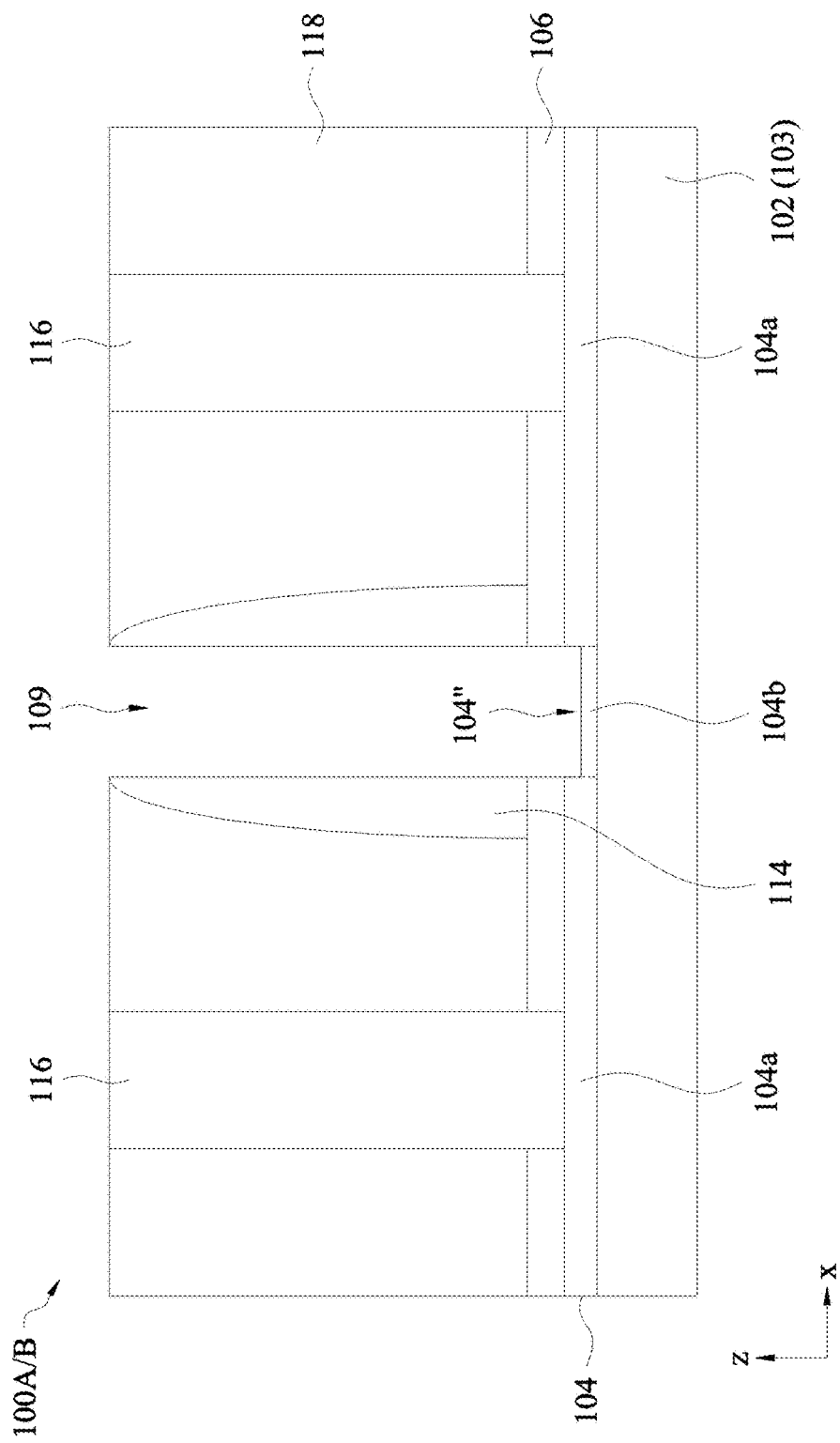

In an embodiment, the method 200 proceeds to an optional operation 224 (FIG. 2B) to reduce the thickness of the BP layer 104 in the channel region 104b. Referring to FIG. 15, the top surface 104" of the BP layer 104 is recessed in the opening 109. In embodiments, operation 224 is performed without breaking vacuum subsequent to operation 222. In one example, operations 222 and 224 are performed in the chambers 308 and 310 respectively (FIG. 19). After the passivation layer 106" is etched and the BP layer 104 is exposed, the device 100A/B is transferred from the chamber 308 to the chamber 310 without breaking vacuum. Subsequently, the BP layer 104 is etched in the opening 109 to recess the top surface 104". In an embodiment, the etching process is an atomic layer etching (ALE). Operation 224 is optional and is not performed in some embodiments of the method 200. When performed, operation 224 provides for improved design flexibility as different transistors in one BP active region 101 (FIGS. 7A and 7B) can have different BP layer thicknesses (e.g., different numbers of phosphorene layers), whose benefits have been discussed above with respect to FIG. 7B.

Figure 16:
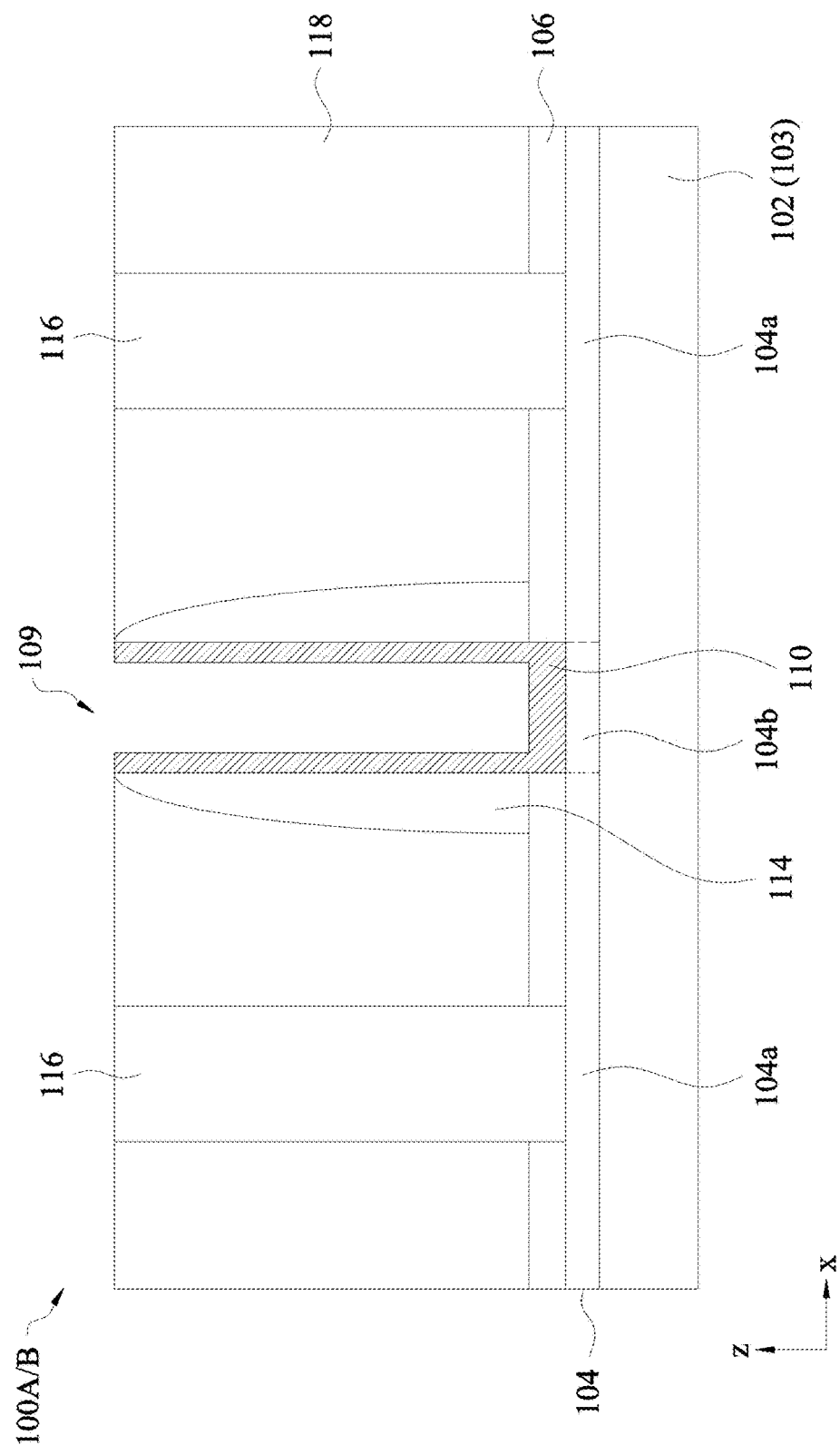

At operation 226, the method 200 (FIG. 2B) deposits a gate dielectric layer 110 over the top surface 104" in the opening 109. Referring to FIG. 16, the gate dielectric layer 110 is in direct contact with the BP layer 104 in the channel region 104b. In the present embodiment, the device 100A/B does not go through the optional operation 224, and operation 226 is performed without breaking vacuum subsequent to operation 222. In one example, operations 222 and 226 are performed in the chambers 308 and 312 respectively (FIG. 19). After the passivation layer 106" (FIG. 13) is etched and the BP layer 104 is exposed (FIG. 14), the device 100A/B is transferred from the chamber 308 to the chamber 312 without breaking vacuum. This ensures that the top surface 104" (FIG. 14) of the BP layer 104 remains substantially free of oxidation. Subsequently, the gate dielectric layer 110 is deposited into the openings 109 in the chamber 312. In an embodiment, the gate dielectric layer 110 is a high-permittivity (high-K) dielectric material with a relative dielectric constant of at least 10, such as 15 or greater. The gate dielectric layer 110 may comprise hafnium oxide ($HfO_2$), zirconium oxide ($ZrO_2$), yttrium oxide ($Y_2O_3$), or other metal oxides.

Figure 17:
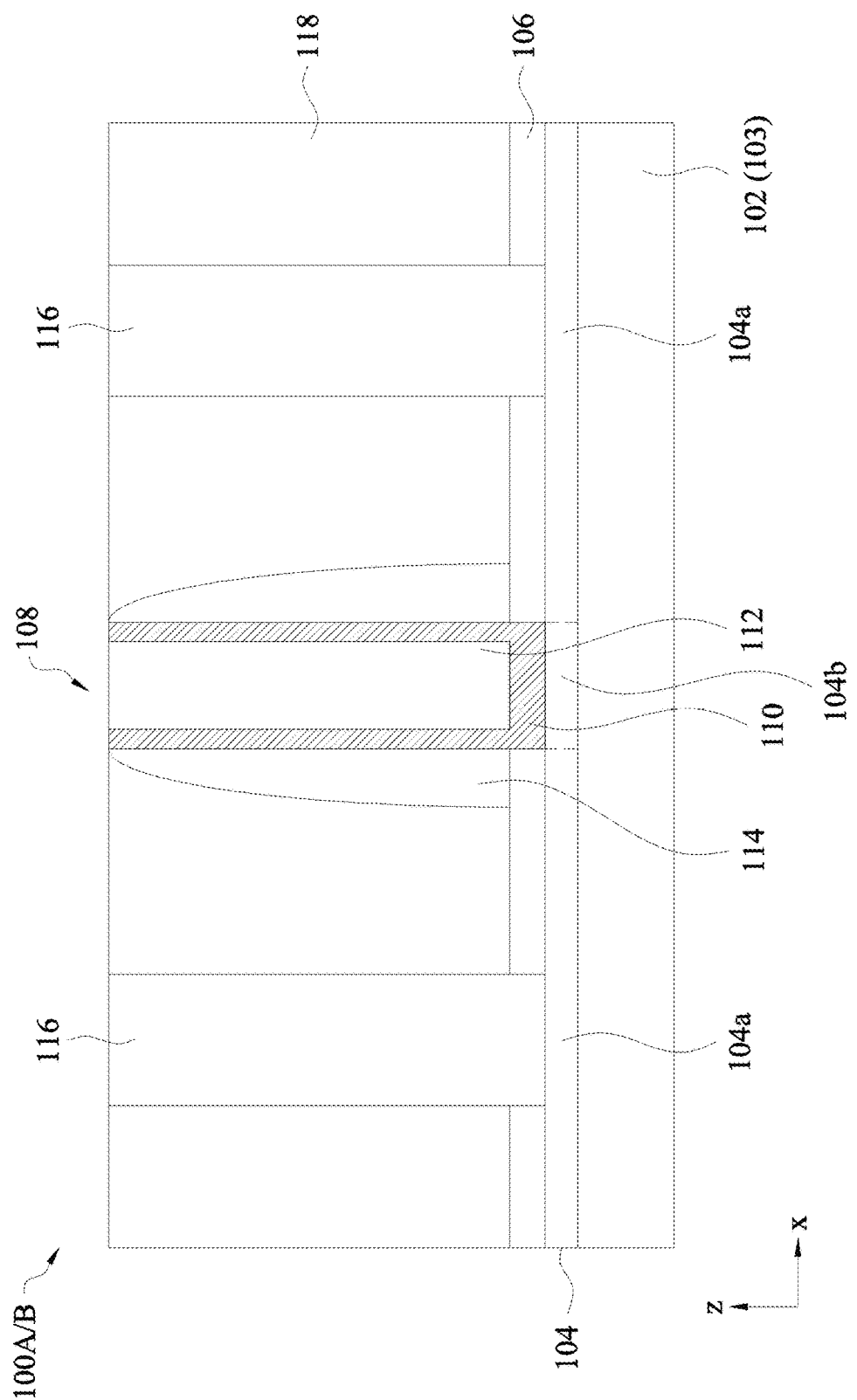

At operation 228, the method 200 (FIG. 2B) forms a gate electrode 112 over the gate dielectric layer 110. Referring to FIG. 17, the gate electrode 112 may comprise one or more metals such as tantalum (Ta), titanium (Ti), tungsten (W), aluminum (Al), or combinations thereof in various embodiments. The gate electrode 112 may also comprise nitrides or carbides of the various metals. In embodiments, the gate electrode 112 may comprise multiple layers of various metals, such as a tungsten layer on a gate work function layer on a barrier layer. The various layers may be formed by CVD, PVD, plating, and/or other suitable processes. A CMP process may be performed to remove excess materials from the gate stack 108 and to planarize a top surface of the device 100A/B. The final gate stack 108 includes the gate dielectric layer 110 and the gate electrode 112.

At operation 230, the method 200 (FIG. 2B) proceeds to further steps to complete the fabrication of the device 100A/B. For example, operation 230 may form a gate contact electrically connecting the gate stack 108, and may form metal interconnects connecting the S/D and gate contacts of the device 100A/B to other devices to form a complete IC. As another example, the method 200 may form a plurality of transistors, wherein a first subset of the transistors have thinner BP layer in the respective channel regions than a second subset of the transistors. In an embodiment for realizing such structure, the method 200 (FIG. 2B) may, after the operation 218 is done, perform the operations 220, 222, 226, and 228 to replace dummy gates in the second subset of transistors while the first subset of transistors are masked. Subsequently, the method 200 performs the operations 220, 222, 224, 226, and 228 to replace dummy gates in the first subset of transistors, thereby forming the first subset of transistors having reduced BP layer thickness in the respective channel regions.

In the present embodiment, the gate-replacement process (including operations 220-228) is performed after the S/D contact formation process (including operations 214-218). However, this is not limiting. In an alternative embodiment, the gate-replacement process is performed before the S/D contact formation process. To further this embodiment, operations 220-228 may be performed after operation 212 and before operation 214.

Although not intended to be limiting, one or more embodiments of the present disclosure provide many benefits to a semiconductor device and the formation thereof. For example, embodiments of the present disclosure provide methods for manufacturing ultra-thin body transistors having a black phosphorus (BP) channel. Some embodiments of the methods form a passivation layer, including surface and/or edge passivation, over a BP layer. The passivation layer prevents the BP layer from being exposed to moisture and air during fabrication processes. When the passivation layer is etched to expose the BP layer in order to form a feature (e.g., an S/D contact or a gate dielectric layer) in direct contact with the BP layer, the passivation etching process and the subsequent deposition process are performed without breaking vacuum to ensure the uniform surface property of the BP layer. Further, embodiments of the present disclosure provide cluster tools with multiple chambers where a device with a surface/edge passivated BP layer can be manufactured. Further still, embodiments of the present disclosure provide methods of separating one large BP layer into multiple smaller BP active regions with each BP active region covered by a surface/edge passivation. In various embodiments, since the surface of the BP layer remains substantially free of oxidation during the fabrication processes, the field-effect transistors employing the BP layer as the ultra-thin channel have uniform and predictable performance.

In one exemplary aspect, the present disclosure is directed to a field-effect transistor (FET). The FET includes a black phosphorus (BP) layer over a substrate. The BP layer includes a channel region, a source region, and a drain region. The FET further includes a passivation layer over the BP layer and in direct contact with the BP layer. The passivation layer provides a first opening over the source region and a second opening over the drain region. The FET further includes a source contact in direct contact with the source region through the first opening and a drain contact in direct contact with the drain region through the second opening. The FET further includes a gate electrode over the channel region. In an embodiment, the passivation layer further includes a third opening over the channel region and the FET further includes a gate dielectric layer in direct contact with the channel region through the third opening, wherein the gate dielectric layer is between the channel region and the gate electrode.

In another exemplary aspect, the present disclosure is directed to an integrated circuit (IC). The IC includes a first transistor having a first gate dielectric layer overlying a first black phosphorus layer having a first thickness, and a second transistor having a second gate dielectric overlying a second black phosphorus layer having a second thickness. The first black phosphorus layer includes a source region and a drain region underneath a first passivation layer. The second black phosphorus layer includes a source region and a drain region underneath a second passivation layer. In an embodiment, the first thickness is different from the second thickness. In an embodiment, the first and second passivation layers are different portions of same passivation layer. In an embodiment, the first and second transistors reside in first and second BP active regions of the IC. In a further embodiment, the first and second BP active regions each include edge passivation. In another embodiment, the first and second transistors reside in same BP active region of the IC, while the first and second thicknesses are different.

In another exemplary aspect, the present disclosure is directed to a method of forming a field effect transistor (FET). The method includes forming a black phosphorus (BP) layer over a substrate and forming a passivation layer over the BP layer without breaking vacuum. The method further includes forming a gate stack over the passivation layer and forming an inter-layer dielectric (ILD) layer over the passivation layer and the gate stack. The method further includes etching the ILD layer to form first openings thereby exposing first portions of the passivation layer. The method further includes removing the first portions of the passivation layer in the first openings to expose the BP layer and depositing a metal in the first openings without breaking vacuum. In an embodiment, the gate stack is a dummy gate stack and the method further includes replacing the dummy gate stack with a final gate stack.

In another exemplary aspect, the present disclosure is directed to a method of forming a field effect transistor (FET). The method includes forming a black phosphorus (BP) layer over a substrate and forming a passivation layer over the BP layer without breaking vacuum. The method further includes forming a dummy gate stack over the passivation layer and forming an inter-layer dielectric (ILD) layer over the passivation layer and the dummy gate stack. The method further includes etching the ILD layer to form first openings on opposing sides of the dummy gate stack, wherein the first openings expose first portions of the passivation layer. The method further includes removing the first portions of the passivation layer in the first openings to expose the BP layer and depositing a metal in the first openings without breaking vacuum. The method further includes removing the dummy gate stack to form a second opening thereby exposing a second portion of the passivation layer. The method further includes removing the second portion of the passivation layer in the second opening to expose the BP layer and depositing a gate dielectric layer over the BP layer in the second opening without breaking vacuum. The method further includes forming a gate electrode over the gate dielectric layer.

Another exemplary transistor includes a phosphorene-containing layer having a channel region, a source region, and a drain region defined therein. A passivation layer is disposed over the phosphorene-containing layer. The transistor further includes a source contact extending through the passivation layer, such that the source contact is coupled with the source region, and a drain contact extending through the passivation layer, such that the drain contact is coupled with the drain region. A gate stack is disposed over the channel region.

In some embodiments, the gate stack extends through the passivation layer, and the gate stack includes a gate dielectric layer and a gate electrode layer disposed over the gate dielectric layer, the gate dielectric extending through the passivation layer and contacting the channel region. In some embodiments, the gate stack includes a gate electrode layer disposed over the passivation layer, such that a portion of the passivation layer serves as a gate dielectric layer of the gate stack. In some embodiments, the passivation layer includes a metal oxide material, a dielectric material, or a semiconductor material. In some embodiments, a surface of the phosphorene-containing layer is free of phosphorous oxide. In some embodiments, the phosphorene-containing layer is disposed over a planar surface of a substrate. In some embodiments, the phosphorene-containing layer is disposed over a non-planar surface of a substrate. In some embodiments, the substrate includes an insulating material.

An exemplary integrated circuit device includes a transistor having a gate stack disposed over a channel region. The channel region is disposed between a source region and a drain region of the transistor. The channel region, the source region, and the drain region are defined in a phosphorene-containing layer disposed over a substrate. A passivation layer is disposed over the source region and the drain region defined in the phosphorene-containing layer. In some embodiments, the integrated circuit device further includes a source contact and a drain contact extending through the passivation layer, such that the source contact is coupled with the source region and the drain contact is coupled with the drain region. In some embodiments, the substrate includes an insulating-containing material layer over which the phosphorene-containing layer is disposed.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a phosphorene-containing layer over a substrate, wherein a channel region, a source region, and a drain region are defined in the phosphorene-containing layer, and further wherein the channel region is disposed between a source region and a drain region; and
    forming a passivation layer over the source region and the drain region defined in the phosphorene-containing layer.

2. The method of claim 1, wherein the forming the passivation layer includes:
    depositing a metal-containing layer over the phosphorene-containing layer; and
    oxidizing the metal-containing layer.

3. The method of claim 2, wherein the oxidizing the metal-containing layer includes exposing the metal-containing layer to air.

4. The method of claim 1, wherein the forming the passivation layer includes performing an atomic layer deposition process to deposit a metal-and-oxygen-containing layer over the phosphorene-containing layer.

5. The method of claim 1, wherein the forming the phosphorene-containing layer and the forming the passivation layer are performed without breaking vacuum.

6. The method of claim 1, further comprising forming a gate structure over the channel region defined in the phosphorene-containing layer, wherein the gate structure includes a gate electrode disposed over the passivation layer, such that a portion of the passivation layer serves as a gate dielectric of the gate structure.

7. The method of claim 1, further comprising forming a gate structure over the channel region defined in the phosphorene-containing layer, wherein the gate structure includes a gate dielectric and a gate electrode, the gate dielectric extending through the passivation layer and contacting the channel region.

8. The method of claim 1, wherein forming the passivation layer includes forming a first passivation layer over a top surface of the phosphorene-containing layer and forming a second passivation layer over side surfaces of the phosphorene-containing layer.

9. The method of claim 1, wherein the substrate includes a fin structure, and further wherein the phosphorene-containing layer and the passivation layer are formed over surfaces defining the fin structure.

10. A method comprising:
    forming a phosphorene-containing layer over a substrate;
    forming a passivation layer over the phosphorene-containing layer;
    forming a gate structure over the passivation layer, wherein the gate structure is positioned over a channel region defined in the phosphorene-containing layer;
    forming a source contact that extends through the passivation layer, such that the source contact is coupled with a source region defined in the phosphorene-containing layer; and
    forming a drain contact that extends through the passivation layer, such that the drain contact is coupled with a drain region defined in the phosphorene-containing layer.

11. The method of claim 10, wherein the forming the source contact and the drain contact includes:
    depositing an interlayer dielectric layer over the passivation layer;
    etching the interlayer dielectric layer to form a first contact opening and a second contact opening that respectively expose a first portion and a second portion of the passivation layer;
    etching the first portion and the second portion of the passivation layer to extend the first contact opening and the second contact opening, such that the first contact opening and the second contact opening respectively expose the source region and the drain region defined in the phosphorene-containing layer; and
    filling the first contact opening and the second contact opening with a metal-containing material.

12. The method of claim 10, wherein the forming the gate structure includes:
    forming a dummy gate of the gate structure; and
    replacing the dummy gate with a metal gate.

13. The method of claim 12, wherein the dummy gate is replaced with the metal gate after forming the source contact and the drain contact.

14. The method of claim 12, wherein the dummy gate is replaced with the metal gate before forming the source contact and the drain contact.

15. The method of claim 12, wherein the replacing the dummy gate with the metal gate includes:
    etching the dummy gate to form a gate opening in the gate structure that exposes a portion of the passivation layer;
    etching the portion of the passivation layer to extend the gate opening, such that gate opening exposes the channel region defined in the phosphorene-containing layer; and
    depositing a gate dielectric and a gate electrode in the gate opening.

16. The method of claim 15, wherein the replacing the dummy gate with the metal gate further includes reducing a thickness of the phosphorene-containing layer exposed by the gate opening.

17. A method comprising:

depositing a phosphorene-containing layer;

depositing a passivation layer over the phosphorene-containing layer;

patterning the phosphorene-containing layer and the passivation layer to define an active region that corresponds with a transistor, wherein the transistor includes a channel region and source/drain regions defined in the phosphorene-containing layer;

forming a gate over a first portion of the passivation layer disposed over the channel region defined in the phosphorene-containing layer;

depositing an interlayer dielectric layer over the passivation layer;

etching the interlayer dielectric layer to form first openings, thereby exposing second portions of the passivation layer;

etching the second portions of the passivation layer to extend the first openings, thereby exposing the source/drain regions defined in the phosphorene-containing layer; and filling the first openings with a conductive material.

18. The method of claim 17, wherein the phosphorene-containing layer is deposited over a dielectric-containing layer.

19. The method of claim 17, wherein the phosphorene-containing layer and the passivation layer are deposited over a fin structure.

20. The method of claim 17, wherein the passivation layer is a first passivation layer, the method further comprising, after patterning the phosphorene-containing layer and the passivation layer, forming a second passivation layer over portions of the phosphorene-containing layer not covered by the first passivation layer.

* * * * *